United States Patent
Yamashita et al.

(10) Patent No.: US 8,084,183 B2
(45) Date of Patent: *Dec. 27, 2011

(54) RESIST COMPOSITION FOR ELECTRON BEAM, X-RAY, OR EUV, AND PATTERN-FORMING METHOD USING THE SAME

(75) Inventors: Katsuhiro Yamashita, Shizuoka (JP); Yasutomo Kawanishi, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 184 days.

This patent is subject to a terminal disclaimer.

(21) Appl. No.: 12/184,313

(22) Filed: Aug. 1, 2008

(65) Prior Publication Data

US 2009/0047598 A1 Feb. 19, 2009

(30) Foreign Application Priority Data

Aug. 2, 2007 (JP) ................................. 2007-202026

(51) Int. Cl.
*G03F 7/039* (2006.01)
*G03F 7/20* (2006.01)
*G03F 7/30* (2006.01)

(52) U.S. Cl. ..................... 430/270.1; 430/326; 430/905; 430/922; 430/942; 430/966

(58) Field of Classification Search .................. None
See application file for complete search history.

(56) References Cited

U.S. PATENT DOCUMENTS

| | | | |
|---|---|---|---|
| 6,548,221 B2 | 4/2003 | Uetani et al. | |
| 6,680,157 B1 | 1/2004 | Fedynyshyn | |
| 7,541,131 B2 * | 6/2009 | Kawanishi | 430/270.1 |
| 2007/0037091 A1 | 2/2007 | Koitabashi et al. | |
| 2007/0184384 A1* | 8/2007 | Kawanishi | 430/270.1 |
| 2008/0085468 A1* | 4/2008 | Kamimura et al. | 430/286.1 |

FOREIGN PATENT DOCUMENTS

| | | |
|---|---|---|
| EP | 1480078 A1 | 11/2004 |
| EP | 1 693 705 A2 * | 8/2006 |
| EP | 1705518 A | 9/2006 |
| EP | 1906241 A1 | 4/2008 |
| JP | 2005-37887 A | 2/2005 |
| JP | 2005-37888 A | 2/2005 |
| JP | 2006-78760 A | 3/2006 |
| JP | 2006-171568 A | 6/2006 |
| JP | 2006-215271 A | 8/2006 |
| JP | 2007094356 A | 4/2007 |

OTHER PUBLICATIONS

Jerry March, "Advanced Organic Chemistry—Fourth Edition", Wiley Interscience, ISBN: 0-471-60180-2, pp. 17-19 and pp. 273-275, (1992).

European Patent Office communication dated May 11, 2010, issued in European Patent Application No. 08013855.5-1226.

* cited by examiner

*Primary Examiner* — Sin J. Lee
(74) *Attorney, Agent, or Firm* — Sughrue Mion, PLLC

(57) ABSTRACT

A positive resist composition for electron beam, X-ray or EUV includes (A) a compound represented by the following formula (I), and (B) a resin capable of decomposing by the action of an acid to increase solubility in an alkali developing solution, which includes a repeating unit represented by the following formula (II) and a repeating unit represented by the following formula (III):

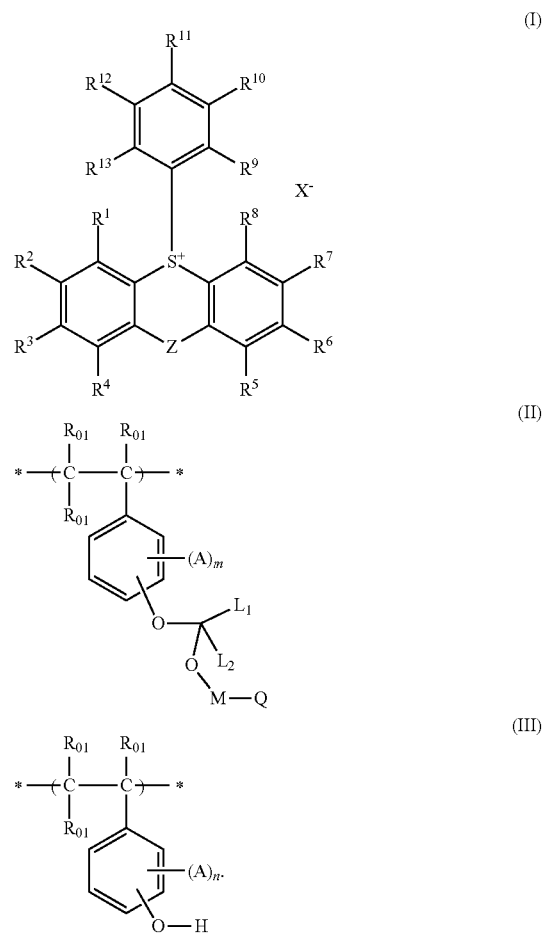

20 Claims, No Drawings

RESIST COMPOSITION FOR ELECTRON BEAM, X-RAY, OR EUV, AND PATTERN-FORMING METHOD USING THE SAME

BACKGROUND OF THE INVENTION

1. Field of the Invention

The present invention relates to a photosensitive composition capable of changing the property by reaction upon irradiation with actinic ray or radiation (electron beam, X-ray, EUV, UV, etc.), a compound for use in the photosensitive composition, and a pattern-forming method using the photosensitive composition. More specifically, the invention relates to a photosensitive composition for use in a manufacturing process of semiconductors, e.g., IC, the manufacture of circuit substrates such as liquid crystals, thermal heads and the like, and other photo-fabrication processes, lithographic printing plates, and acid-curable compositions, and also the invention relates to a compound for use in the photosensitive composition, and a pattern-forming method using the photosensitive composition.

2. Description of the Related Art

Chemical amplification resist compositions are pattern-forming materials capable of generating an acid at the area irradiated with radiation such as a far ultraviolet ray, changing the solubility in a developing solution of the area irradiated with the actinic radiation and the non-irradiated area by the reaction with the acid as a catalyst, and forming a pattern on a substrate.

When a KrF excimer laser is used as the exposure light source, resins having poly(hydroxystyrene) as a fundamental skeleton that is small in absorption in the region of 248 nm are mainly used, so that a high sensitivity and high resolution are secured and good pattern is formed as compared with conventionally used naphthoquinonediazide/novolak resins.

On the other hand, when a light source of further shorter wavelength, e.g., an ArF excimer laser (193 nm), is used as the exposure light source, since compounds having an aromatic group substantially show large absorption in the region of 193 nm, even the above chemical amplification resist compositions are not sufficient.

To cope with this problem, resists for an ArF excimer laser containing a resin having an alicyclic hydrocarbon structure have been developed.

Regarding an acid generator that is the main constituent of chemical amplification resists, triphenylsulfonium salts are generally known (e.g., refer to U.S. Pat. No. 6,548,221).

Further, when light sources such as electron beams, X-rays and EUV are used, exposure is carried out under vacuum, so that compounds having a low boiling point such as solvents and resist materials decomposed by high energy are volatilized to contaminate the exposure apparatus, i.e., outgassing is a serious problem. In recent years, various investigations are in progress on the reduction of outgassing, and a variety of trials are suggested, e.g., restraint of volatilization of low molecular weight compounds by forming a top coat layer (e.g., refer to EP 1,480,078), and addition of a radical trapping agent capable of inhibiting decomposition of a polymer (e.g., refer to U.S. Pat. No. 6,680,157). In connection with acid generators, some contrivances are also required on the reduction of outgassing.

Acid generators are also examined from various aspects as disclosed in JP-A-2006-78760 (The term "JP-A" as used herein refers to an "unexamined published Japanese patent application".), JP-A-2006-171568, JP-A-2005-37887, JP-A-2005-37888, U.S. 2007/0037091 and JP-A-2006-215271.

However, acid generators are still insufficient in various points, so that a resist composition improved in sensitivity, resolution, a pattern form, and roughness is required.

SUMMARY OF THE INVENTION

The invention provides a resist composition excellent in sensitivity, resolution, roughness, a pattern shape, and outgassing characteristics, and also provides a pattern-forming method using the resist composition.

The above objects are dissolved by the following means.

<1> A positive resist composition for electron beam, X-ray or EUV comprising:

(A) a compound represented by the following formula (I), and (B) a resin capable of decomposing by the action of an acid to increase solubility in an alkali developing solution, which comprises a repeating unit represented by the following formula (II) and a repeating unit represented by the following formula (III):

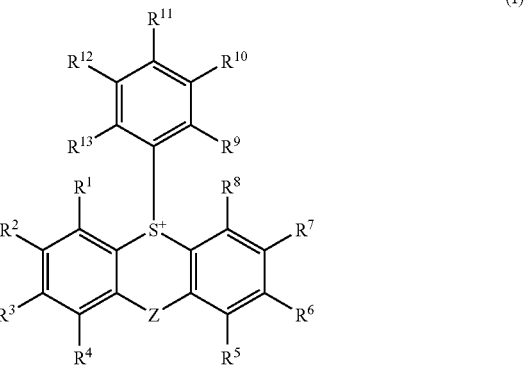

wherein each of $R^1$ to $R^{13}$ independently represents a hydrogen atom or a substituent, provided that at least one of $R^1$ to $R^{13}$ represents a substituent containing an alcoholic hydroxyl group;

Z represents a single bond or a divalent linking group; and $X^-$ represents a counter anion;

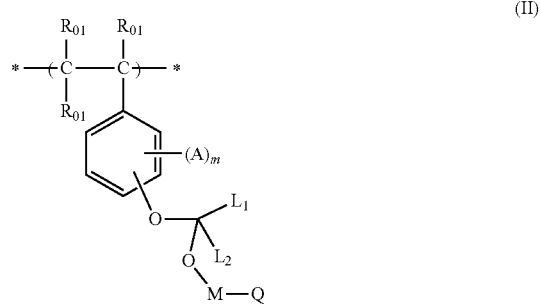

-continued

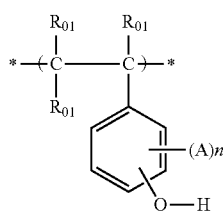
(III)

wherein each $R_{01}$ independently represents a hydrogen atom, an alkyl group, a cycloalkyl group, a halogen atom, a cyano group, or an alkoxycarbonyl group;

$L_1$ and $L_2$ may be the same as or different from each other, and each of $L_1$ and $L_2$ independently represents a hydrogen atom, an alkyl group, a cycloalkyl group, or an aralkyl group;

M represents a single bond or a divalent linking group;

Q represents an alkyl group, a cycloalkyl group, or an alicyclic or aromatic ring group which may contain a hetero atom; and at least two of Q, M and $L_1$ may be bonded to each other to form a 5- or 6-membered ring;

A represents a halogen atom, a cyano group, an acyl group, an alkyl group, an alkoxyl group, an acyloxy group, or an alkoxycarbonyl group; and each of m and n independently represents an integer of from 0 to 4, provided that m and n do not represent 0 at the same time.

<2> A positive resist composition for electron beam, X-ray or EUV comprising:

(A) a compound represented by the following formula (I), and (B) a resin capable of decomposing by the action of an acid to increase solubility in an alkali developing solution, which comprises a repeating unit represented by the following formula (II), a repeating unit represented by the following formula (III), and a repeating unit represented by the following formula (IV):

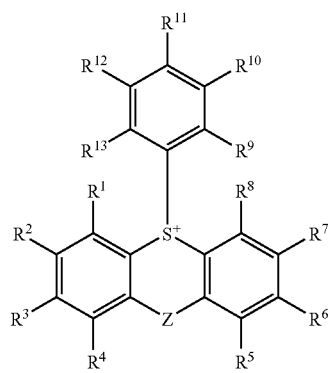
(I)

wherein each of $R^1$ to $R^{13}$ independently represents a hydrogen atom or a substituent, provided that at least one of $R^1$ to $R^{13}$ represents a substituent containing an alcoholic hydroxyl group;

Z represents a single bond or a divalent linking group; and
$X^-$ represents a counter anion;

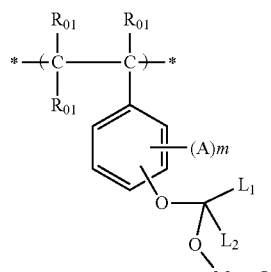
(II)

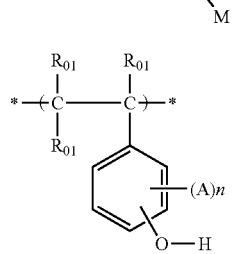
(III)

wherein each $R_{01}$ independently represents a hydrogen atom, an alkyl group, a cycloalkyl group, a halogen atom, a cyano group, or an alkoxycarbonyl group;

$L_1$ and $L_2$ may be the same as or different from each other, and each of $L_1$ and $L_2$ independently represents a hydrogen atom, an alkyl group, a cycloalkyl group, or an aralkyl group;

M represents a single bond or a divalent linking group;

Q represents an alkyl group, a cycloalkyl group, or an alicyclic or aromatic ring group which may contain a hetero atom; and at least two of Q, M and $L_1$ may be bonded to each other to form a 5- or 6-membered ring;

A represents a halogen atom, a cyano group, an acyl group, an alkyl group, an alkoxyl group, an acyloxy group, or an alkoxycarbonyl group; and each of m and n independently represents an integer of from 0 to 4;

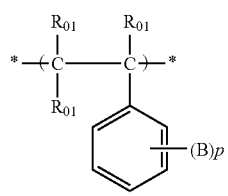
(IV)

wherein each $R_{01}$ independently represents a hydrogen atom, an alkyl group, a cycloalkyl group, a halogen atom, a cyano group, or an alkoxycarbonyl group;

B represents a halogen atom, a cyano group, an acyl group, an alkyl group, an alkoxyl group, an acyloxy group, or an alkoxycarbonyl group; and p represents an integer of from 0 to 5.

<3> The positive resist composition for electron beam, X-ray or EUV according to <1> or <2>, wherein the resin (B) has a weight average molecular weight of 5,000 or less.

<4> The positive resist composition for electron beam, X-ray or EUV according to any one of <1> to <3>, further comprising:
   a basic compound.

<5> The positive resist composition for electron beam, X-ray or EUV according to any one of <1> to <4>, wherein
   a concentration of all solid contents of the positive resist composition is from 0.2 to 4 mass %.

<6> The positive resist composition for electron beam, X-ray or EUV according to any one of <1> to <5>, wherein
   X⁻ in formula (I) is an anion represented by the following formula (X):

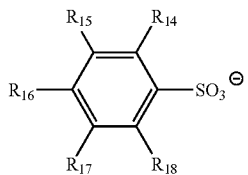

(X)

wherein
   each of $R_{14}$ to $R_{18}$ independently represents a hydrogen atom or a substituent.

<7> The positive resist composition for electron beam, X-ray, or EUV according to any one of <1> to <6>, which is exposed with electron beam, X-ray, or EUV.

<8> A pattern-forming method comprising:
   forming a resist film with the composition according to any one of <1> to <7>,
   exposing the resist film with electron beam, X-ray, or EUV, and developing the resist film.

DETAILED DESCRIPTION OF THE INVENTION

The invention will be described in detail below.

In the description of a group (an atomic group) in the specification of the invention, the description not referring to substitution or unsubstitution includes both a group not having a substituent and a group having a substituent. For example, "an alkyl group" includes not only an alkyl group having no substituent (an unsubstituted alkyl group) but also an alkyl group having a substituent (a substituted alkyl group).

As the compound capable of generating an acid upon irradiation with actinic ray or radiation (an acid generator), the invention uses a novel compound represented by formula (I) (hereinafter also referred to as "acid generator A1").

A resist composition containing acid generator A1 may be either a positive or negative resist composition.

A positive resist composition in the invention contains acid generator (A), and resin (B) capable of decomposing by the action of an acid to increase solubility in an alkali developing solution, and if necessary, dissolution inhibiting compound (E) capable of decomposing by the action of an acid to increase solubility in an alkali developing solution having a molecular weight of 3,000 or less.

A negative resist composition in the invention contains acid generator (A), resin (C) soluble in an alkali developing solution, and acid crosslinking agent (D) capable of crosslinking with the resin soluble in an alkali developing solution by the action of an acid.

[1] A Compound Represented by Formula (I) (Acid Generator A1):

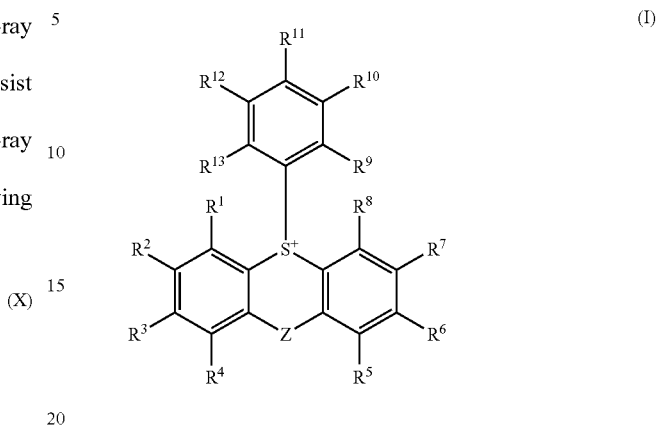

In formula (I), each of $R^1$ to $R^{13}$ independently represents a hydrogen atom or a substituent, and at least one of $R^1$ to $R^{13}$ is a substituent containing an alcoholic hydroxyl group.

Z represents a single bond or a divalent linking group.

X⁻ represents a counter anion.

The alcoholic hydroxyl group in the invention means a hydroxyl group bonding to the carbon atom of an alkyl group.

When $R^1$ to $R^{13}$ each represents a substituent containing an alcoholic hydroxyl group, each of $R^1$ to $R^{13}$ is represented by —W—Y, where Y is an alkyl group substituted with a hydroxyl group, and W is a single bond or a divalent linking group.

As the alkyl group represented by Y, a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbonyl group, and a boronyl group can be exemplified, preferably an ethyl group, a propyl group, an isopropyl group, an n-butyl group, an isobutyl group, and a sec-butyl group, and more preferably an ethyl group, a propyl group, and an isopropyl group. Y especially preferably has a structure of —CH₂CH₂OH.

The divalent linking group represented by W is not especially restricted, and, for example, divalent groups obtained by substituting an arbitrary hydrogen atom of a monovalent group with a single bond can be exemplified, and as such monovalent groups, e.g., an alkoxyl group, an acyloxy group, a carbamoyloxy group, an alkoxycarbonyloxy group, an aryloxycarbonyloxy group, an acylamino group, an aminocarbonylamino group, an alkoxycarbonylamino group, an aryloxycarbonylamino group, a sulfamoylamino group, an alkylsulfonylamino group, an arylsulfonylamino group, an alkylthio group, an arylthio group, a sulfamoyl group, an alkylsulfinyl group, an arylsulfinyl group, an alkylsulfonyl group, an arylsulfonyl group, an acyl group, an aryloxycarbonyl group, an alkoxycarbonyl group, and a carbamoyl group can be exemplified.

W preferably represents a single bond, or a divalent group obtained by substituting an arbitrary hydrogen atom of an alkoxyl group, an acyloxy group, an acylamino group, an alkylsulfonylamino group, an arylsulfonylamino group, an alkylthio group, an alkylsulfonyl group, an acyl group, an alkoxycarbonyl group, or a carbamoyl group with a single bond, and more preferably a single bond, or a divalent group obtained by substituting an arbitrary hydrogen atom of an acyloxy group, an alkylsulfonyl group, an acyl group, or an alkoxycarbonyl group with a single bond.

When $R^1$ to $R^{13}$ each represents a substituent containing an alcoholic hydroxyl group, the number of carbon atoms contained in the substituent is preferably from 2 to 10, more preferably from 2 to 6, and especially preferably from 2 to 4.

The substituent containing an alcoholic hydroxyl group represented by $R^1$ to $R^{13}$ may have two or more alcoholic hydroxyl groups. The number of the alcoholic hydroxyl groups of the substituent containing an alcoholic hydroxyl group represented by $R^1$ to $R^{13}$ is from 1 to 6, preferably from 1 to 3, and more preferably 1.

The number of alcoholic hydroxyl groups of the compound represented by formula (I) is from 1 to 10 in total of $R^1$ to $R^3$, preferably from 1 to 6, and more preferably from 1 to 3.

When each of $R^1$ to $R^{13}$ does not contain an alcoholic hydroxyl group, each of $R^1$ to $R^{13}$ independently represents a hydrogen atom or a substituent, and any substituent may be used with no particular restriction, e.g., a halogen atom, an alkyl group (including a cycloalkyl group, a bicycloalkyl group, and a tricycloalkyl group), an alkenyl group (including a cycloalkenyl group, and a bicycloalkenyl group), an alkynyl group, an aryl group, a heterocyclic group, a cyano group, a nitro group, a carboxyl group, an alkoxyl group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, an imido group, a phosphino group, a phosphinyl group, a phosphinyloxy group, a phosphinylamino group, a phosphono group, a silyl group, a hydrazino group, a ureido group, a boronic acid group (—B(OH)$_2$), a phosphato group (—OPO(OH)$_2$), a sulfato group (—OSO$_3$H), and other known substituents are exemplified as the substituents.

Further, contiguous two of $R^1$ to $R^{13}$ can also form a ring together (e.g., aromatic or non-aromatic hydrocarbon rings, heterocyclic rings, and polycyclic condensed rings formed by combination of these rings, e.g., a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxthiin ring, a phenothiazine ring, and a phenazine ring are exemplified).

When each of $R^1$ to $R^{13}$ does not contain an alcoholic hydroxyl group, $R^1$ to $R^{13}$ each preferably represents a hydrogen atom, a halogen atom, an alkyl group (including a cycloalkyl group, a bicycloalkyl group and a tricycloalkyl group), an alkenyl group (including a cycloalkenyl group and a bicycloalkenyl group), an alkynyl group, an aryl group, a cyano group, a carboxyl group, an alkoxyl group, an aryloxy group, an acyloxy group, a carbamoyloxy group, an acylamino group, an aminocarbonylamino group, an alkoxycarbonylamino group, an aryloxycarbonylamino group, a sulfamoylamino group, an alkylsulfonylamino group, an arylsulfonylamino group, an alkylthio group, an arylthio group, a sulfamoyl group, an alkylsulfonyl group, an arylsulfonyl group, an aryloxycarbonyl group, an alkoxycarbonyl group, a carbamoyl group, an imido group, a silyl group, or a ureido group.

When each of $R^1$ to $R^{13}$ does not contain an alcoholic hydroxyl group, $R^1$ to $R^{13}$ each more preferably represents a hydrogen atom, a halogen atom, an alkyl group (including a cycloalkyl group, a bicycloalkyl group, and a tricycloalkyl group), a cyano group, an alkoxyl group, an acyloxy group, an acylamino group, an aminocarbonylamino group, an alkoxycarbonylamino group, an alkylsulfonylamino group, an arylsulfonylamino group, an alkylthio group, a sulfamoyl group, an alkylsulfonyl group, an arylsulfonyl group, an alkoxycarbonyl group, or a carbamoyl group.

Further, when each of $R^1$ to $R^{13}$ does not contain an alcoholic hydroxyl group, $R^1$ to $R^{13}$ each especially preferably represents a hydrogen atom, an alkyl group (including a cycloalkyl group, a bicycloalkyl group, and a tricycloalkyl group), a halogen atom, or an alkoxyl group.

In formula (I), at least one of $R^1$ to $R^{13}$ contains an alcoholic hydroxyl group, and preferably at least one of $R^9$ to $R^{13}$ contains an alcoholic hydroxyl group.

Z represents a single bond or a divalent linking group, and as the divalent linking groups, e.g., an alkylene group, an arylene group, a carbonyl group, a sulfonyl group, a carbonyloxy group, a carbonylamino group, a sulfonylamino group, an ether group, a thioether group, an amino group, a disulfide group, an acyl group, an alkylsulfonyl group, —CH═CH—, —C≡C—, an aminocarbonylamino group, and an aminosulfonylamino group are exemplified, which groups may have a substituent. As the substituents of these groups, the same substituents as those described in $R^1$ to $R^{13}$ are exemplified. Z preferably represents a single bond, or a substituent not having an electron attractive property, e.g., an alkylene group, an arylene group, an ether group, a thioether group, an amino group, —CH═CH—, —C≡C—, an aminocarbonyl-amino group, or an aminosulfonylamino group, more preferably a single bond, an ether group, or a thioether group, and especially preferably a single bond.

The compound represented by formula (I) has a counter anion X$^-$. As the anion, an organic anion is preferred. The organic anion is an anion containing at least one carbon atom. Further, the organic anion is preferably a non-nucleophilic anion. The non-nucleophilic anion is an anion having extremely low ability of causing a nucleophilic reaction and capable of restraining the aging decomposition due to intramolecular nucleophilic reaction.

As the non-nucleophilic anions, e.g., a sulfonate anion, a carboxylate anion, a sulfonylimide anion, a bis(alkylsulfonyl)imide anion, and a tris(alkylsulfonyl)methyl anion can be exemplified.

As the non-nucleophilic sulfonate anions, e.g., an alkylsulfonate anion, an arylsulfonate anion, and a camphorsulfonate anion are exemplified. As the non-nucleophilic carboxylate anions, e.g., an alkylcarboxylate anion, an arylcarboxylate anion and an aralkylcarboxylate anion are exemplified.

The alkyl moiety in the alkylsulfonate anion may be an alkyl group or a cycloalkyl group, preferably an alkyl group having from 1 to 30 carbon atoms and a cycloalkyl group having from 3 to 30 carbon atoms, e.g., a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbonyl group, and a boronyl group can be exemplified.

The aryl group in the arylsulfonate anion is preferably an aryl group having from 6 to 14 carbon atoms, e.g., a phenyl group, a tolyl group, and a naphthyl group can be exemplified.

As the substituents of the alkyl group, cycloalkyl group and aryl group of the alkylsulfonate anion and arylsulfonate anion, e.g., a nitro group, a halogen atom (a fluorine atom, a chlorine atom, a bromine atom, and an iodine atom), a carboxyl group, a hydroxyl group, an amino group, a cyano group, an alkoxyl group (preferably having from 1 to 5 carbon atoms), a cycloalkyl group (preferably having from 3 to 15 carbon atoms), an aryl group (preferably having from 6 to 14 carbon atoms), an alkoxycarbonyl group (preferably having from 2 to 7 carbon atoms), an acyl group (preferably having from 2 to 12 carbon atoms), and an alkoxycarbonyloxy group (preferably having from 2 to 7 carbon atoms) can be exemplified. As for the aryl group and cyclic structure of each group, an alkyl group (preferably having from 1 to 15 carbon atoms) can further be exemplified as the substituent.

As the alkyl moiety in the alkylcarboxylate anion, the same alkyl groups and cycloalkyl groups as in the alkylsulfonate anion can be exemplified. As the aryl group in the arylcarboxylate anion, the same aryl groups as in the arylsulfonate anion can be exemplified. As the aralkyl group in the aralkylcarboxylate anion, preferably an aralkyl group having from 6 to 12 carbon atoms, e.g., a benzyl group, a phenethyl group, a naphthylmethyl group, and a naphthylethyl group can be exemplified.

As the substituents of the alkyl group, cycloalkyl group, aryl group and aralkyl group in the alkylcarboxylate anion, arylcarboxylate anion and aralkyl-carboxylate anion, e.g., the same halogen atoms, alkyl groups, cycloalkyl groups, alkoxyl groups and alkylthio groups as in the arylsulfonate anion can be exemplified. As the sulfonylimide anion, e.g., a saccharin anion can be exemplified.

The alkyl group in the bis(alkylsulfonyl)imide anion and tris(alkylsulfonyl)-methyl anion is preferably an alkyl group having from 1 to 5 carbon atoms, e.g., a methyl group, an ethyl group, a propyl group, an isopropyl group, an n-butyl group, an isobutyl group, a sec-butyl group, a pentyl group and a neopentyl group are exemplified. As the substituents on these alkyl groups, e.g., a halogen atom, an alkyl group substituted with a halogen atom, an alkoxyl group, and an alkylthio group can be exemplified.

As other non-nucleophilic anions, e.g., fluorinated phosphorus, fluorinated boron and fluorinated antimony can be exemplified.

As the counter anion $X^-$ of the compound represented by formula (I), a sulfonate anion is preferred, and an arylsulfonate anion is more preferred.

As the sulfonate anions, e.g., a methanesulfonate anion, a trifluoromethane-sulfonate anion, a pentafluoroethane-sulfonate anion, a heptafluoropropanesulfonate anion, a perfluorobutanesulfonate anion, a perfluorohexanesulfonate anion, a perfluorooctanesulfonate anion, and a perfluoroethoxyethanesulfonate are exemplified.

An arylsulfonate anion represented by the following formula (X) is especially preferred.

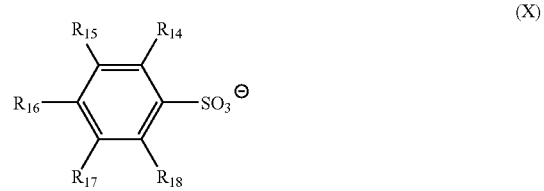

In formula (X), each of $R_{14}$ to $R_{18}$ independently represents a hydrogen atom or a substituent (preferably a halogen atom, an alkyl group or an alkoxyl group).

As the arylsulfonate anion represented by formula (X), a pentafluorobenzene-sulfonate anion, a 3,5-bistrifluoromethylbenzenesulfonate anion, a 2,4,6-triisopropyl-benzenesulfonate anion, a 2,3,5,6-tetrafluoro-4-dodecyloxybenzenesulfonate anion, a p-toluenesulfonate anion, and a 2,4,6-trimethylbenzenesulfonate anion are exemplified.

The addition amount of the compounds represented by formula (I) is preferably from 0.1 to 20 mass % in total based on all the solids content of the resist composition, more preferably from 0.5 to 10 mass %, and still more preferably from 3 to 8 mass %.

The molecular weight of the compounds represented by formula (I) is preferably from 200 to 2,000, and especially preferably from 400 to 1,000.

The compound represented by formula (I) can be synthesized according to the method of condensation reaction of a benzene derivative containing a hydroxyl group protected with a protective group in the substituent and a cyclic sulfoxide compound to form a sulfonium salt, and deprotecting the protective group of the hydroxyl group.

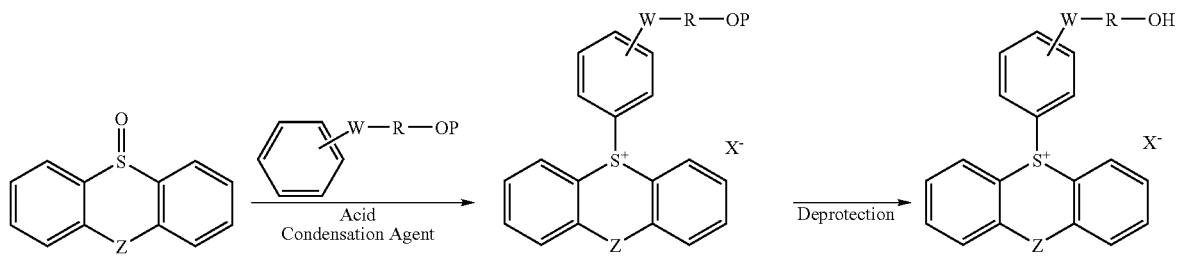

or

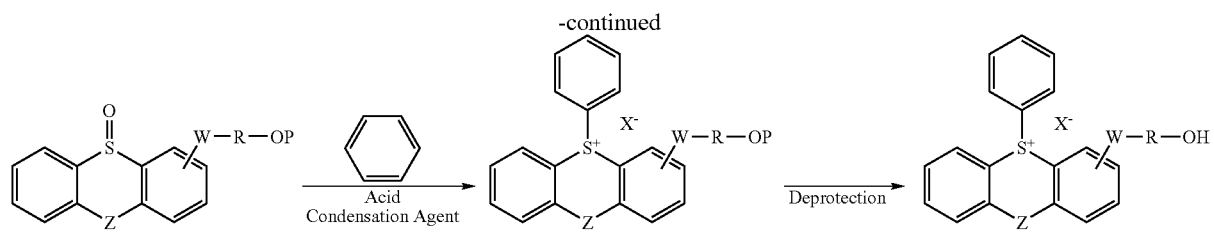

In the above reaction scheme, W represents a divalent linking group, R represents an alkylene group, and P represents a protective group.

As the acids for use in the reaction to form sulfonium, methanesulfonic acid, ethanesulfonic acid, propanesulfonic acid, butanesulfonic acid, pentanesulfonic acid, trifluoromethanesulfonic acid, benzenesulfonic acid, p-toluenesulfonic acid, p-ethylbenzenesulfonic acid, and nonafluorobutanesulfonic acid are exemplified, and the conjugate base of the acid used becomes the anion of the sulfonium. As the condensation agent for use in the reaction to form sulfonium, acid anhydride is exemplified, and strong acid anhydrides, e.g., trifluoroacetic acid anhydride, polyphosphoric acid anhydride, methanesulfonic acid anhydride, trifluoromethane-sulfonic acid anhydride, p-toluenesulfonic acid anhydride, nonafluorobutanesulfonic acid anhydride, tetrafluorosuccinic acid anhydride, hexafluoroglutaric acid anhydride, chlorodifluoroacetic acid anhydride, pentafluoropropionic acid anhydride, and heptafluorobutanoic acid anhydride are exemplified.

As protective group P of a hydroxyl group, ether and ester are exemplified, e.g., methyl ether, aryl ether, benzyl ether, acetic ester, benzoic ester, and carbonic ester are exemplified.

Counter anion X$^-$ can be converted to a desired anion by the addition of the conjugate acid of an objective anion through an ion exchange resin.

The specific examples of the compounds represented by formula (I) are shown below, but the invention is not restricted to these compounds.

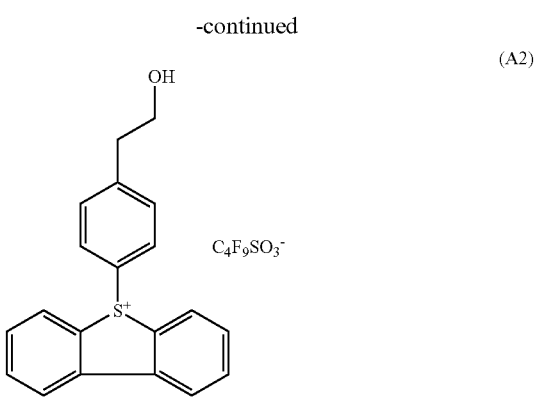

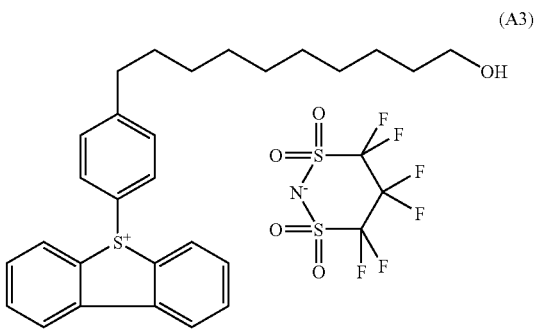

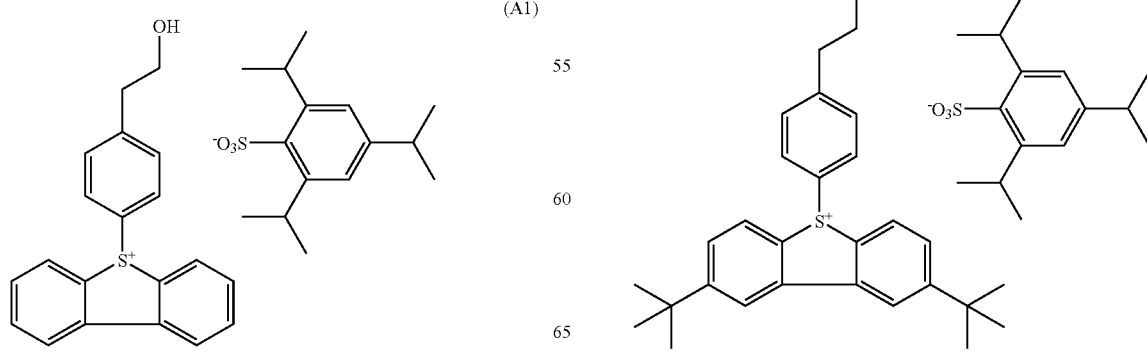

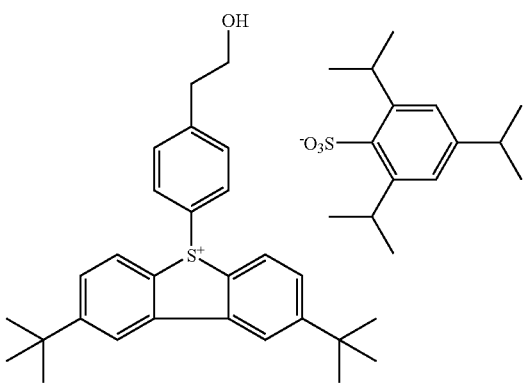

-continued
(A5)
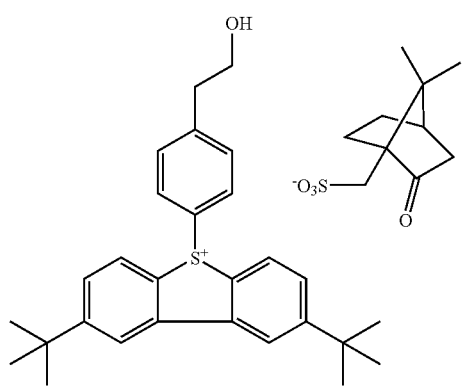
(A6)
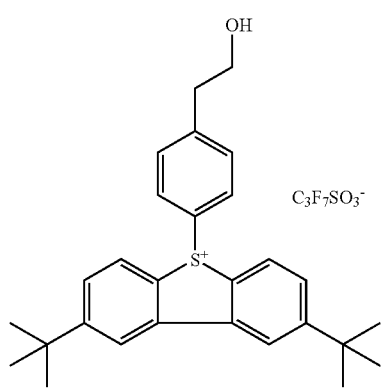
(A7)
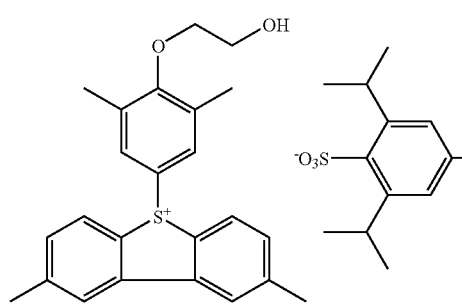
(A8)
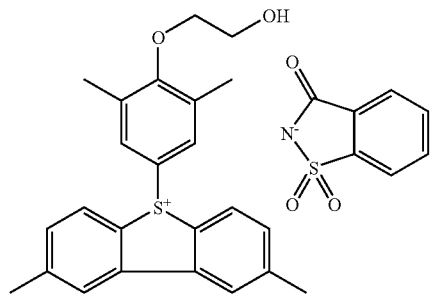
-continued
(A9)
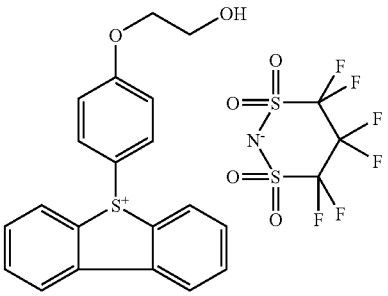
(A10)
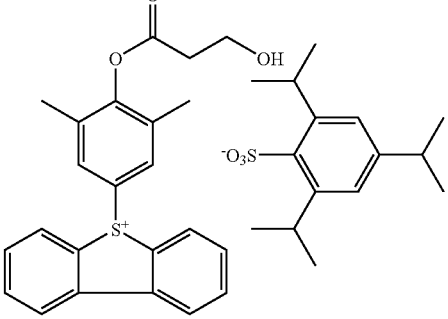
(A11)
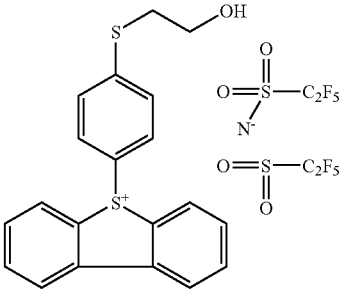
(A12)
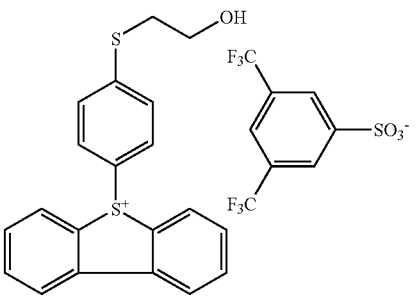
(A13)
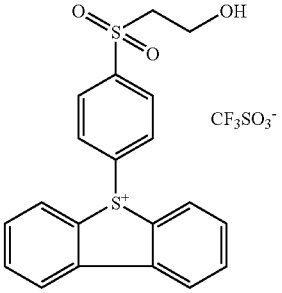

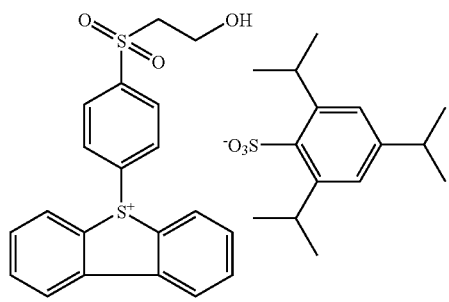 (A14)
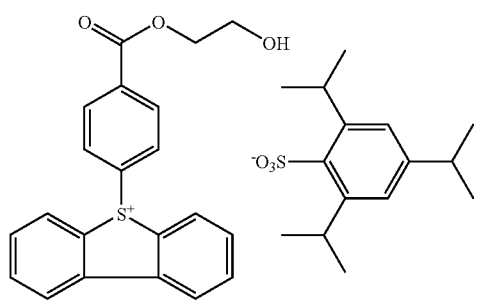 (A15)
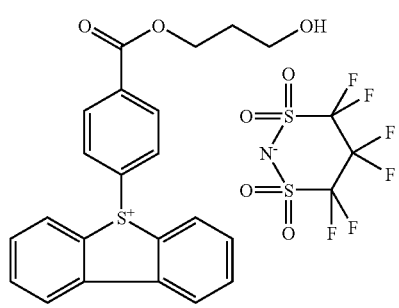 (A16)
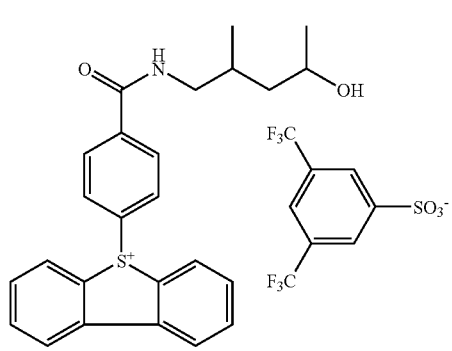 (A17)
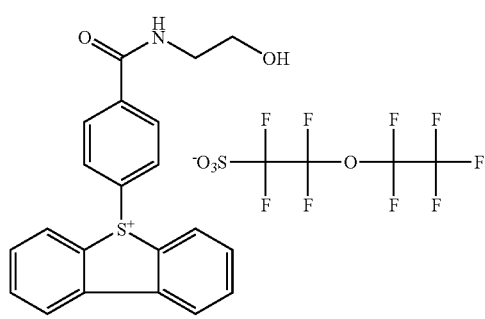 (A18)
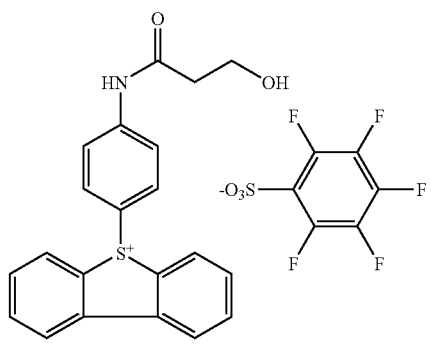 (A19)
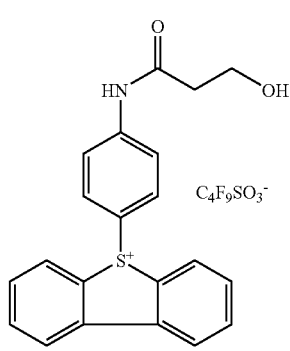 (A20)
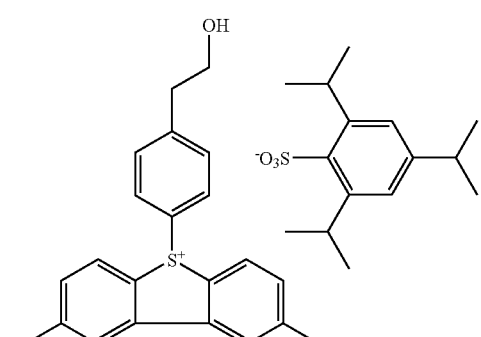 (A21)
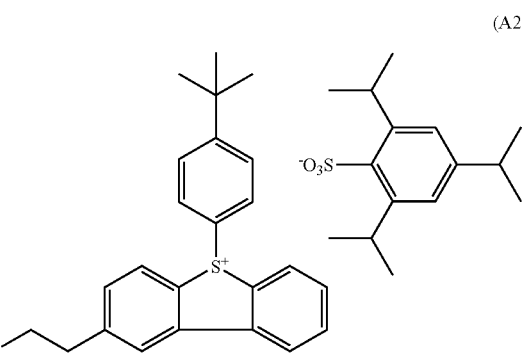 (A22)

(A23) 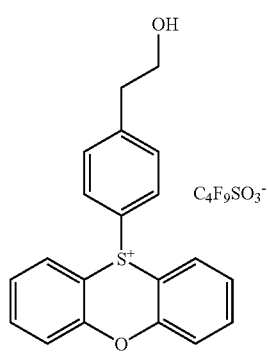
(A24) 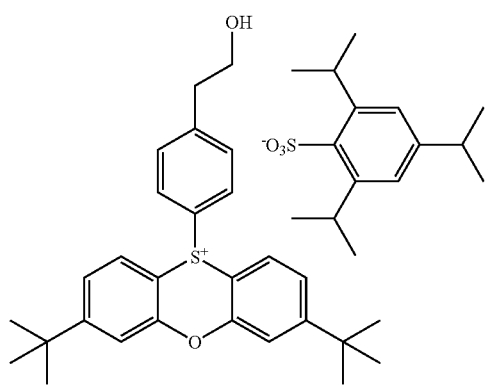
(A25) 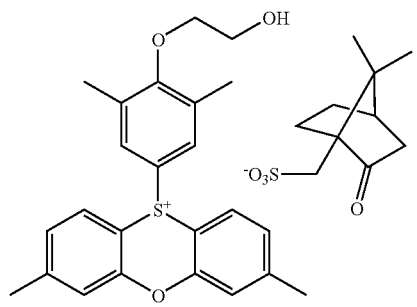
(A26) 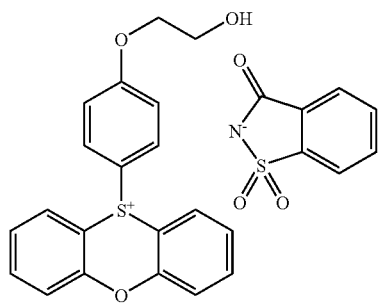
(A27) 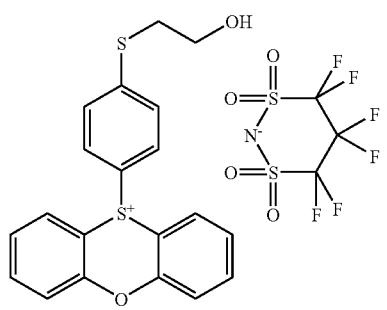
(A28) 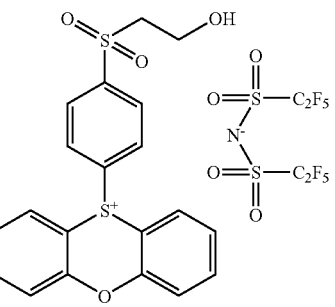
(A29) 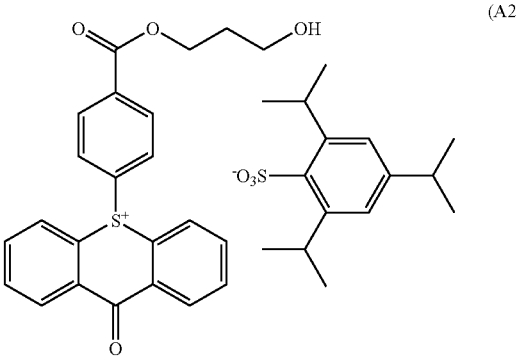
(A30) 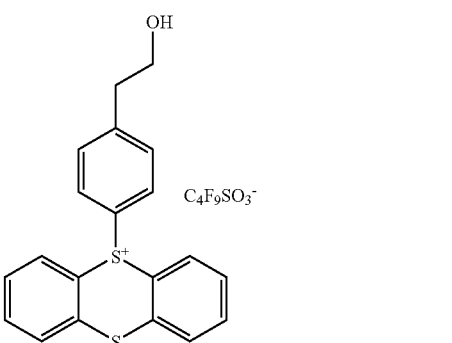
(A31) 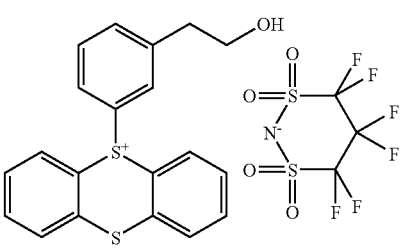
(A32) 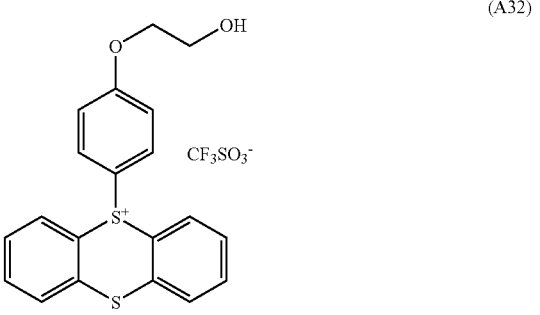

-continued

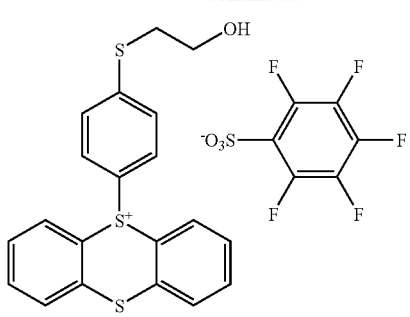
(A33)

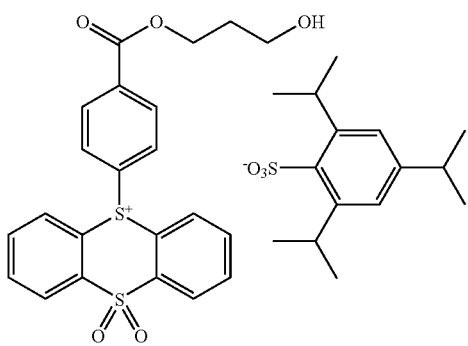
(A34)

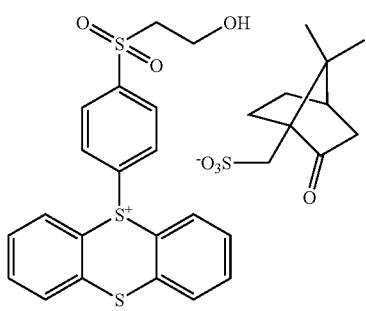
(A35)

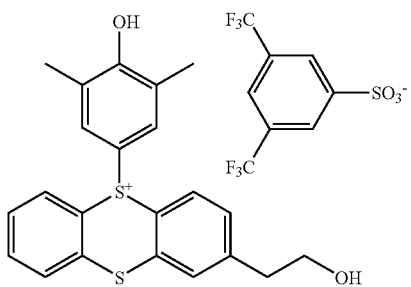
(A36)

[2] Compound Capable of Generating an Acid Upon Irradiation with Actinic Ray or Radiation (Acid Generator A2):

A resist composition in the invention may use other acid generators in combination with acid generator A1. Acid generators other than acid generator A1 are hereinafter referred to as acid generator A2.

As acid generator A2, a photo-initiator for cationic photopolymerization, a photo-initiator for radical photopolymerization, photodecoloring agent for dyestuffs, a photodiscoloring agent, well-known compounds capable of generating an acid upon irradiation with actinic ray or radiation that are used in micro-resists and the like, and the mixtures of these compounds can be optionally selected and used.

For example, as acid generator A2, diazonium salt, phosphonium salt, sulfonium salt, iodonium salt, imidosulfonate, oximesulfonate, diazodisulfone, disulfone, and o-nitrobenzylsulfonate are exemplified.

Further, compounds obtained by introducing a group or a compound capable of generating an acid upon irradiation with actinic ray or radiation to the main chain or side chain of polymers, for example, the compounds disclosed in U.S. Pat. No. 3,849,137, German Patent 3,914,407, JP-A-63-26653, JP-A-55-164824, JP-A-62-69263, JP-A-63-146038, JP-A-63-163452, JP-A-62-153853, JP-A-63-146029, etc., can be used.

The compounds generating an acid by the action of light as disclosed in U.S. Pat. No. 3,779,778, EP 126,712, etc., can also be used.

As preferred compounds among the compounds capable of generating an acid upon irradiation with actinic ray or radiation, compounds represented by any of the following formulae (ZI), (ZII) and (ZIII) can be exemplified.

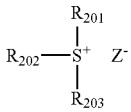
ZI

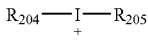
ZII

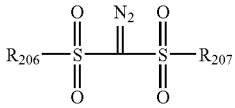
ZIII

In formula (ZI), each of $R_{201}$, $R_{202}$ and $R_{203}$ independently represents an organic group.

The number of carbon atoms of the organic groups represented by $R_{201}$, $R_{202}$ and $R_{203}$ is generally from 1 to 30, and preferably from 1 to 20.

Two of $R_{201}$, $R_{202}$ and $R_{203}$ may be bonded to each other to form a cyclic structure, and an oxygen atom, a sulfur atom, an ester bond, an amido bond or a carbonyl group may be contained in the ring. As the group formed by bonding two of $R_{201}$, $R_{202}$ and $R_{203}$, an alkylene group (e.g., a butylene group and a pentylene group) can be exemplified.

$Z^-$ represents a non-nucleophilic anion.

The examples of the non-nucleophilic anions represented by $Z^-$ include, e.g., a sulfonate anion, a carboxylate anion, a sulfonylimide anion, a bis(alkylsulfonyl)imide anion, and a tris(alkylsulfonyl)methyl anion.

A non-nucleophilic anion is an anion having extremely low ability of causing a nucleophilic reaction and capable of restraining the aging decomposition due to an intramolecular nucleophilic reaction, so that the aging stability of a resist can be improved with a non-nucleophilic anion.

As sulfonate anions, e.g., an aliphatic sulfonate anion, an aromatic sulfonate anion and a camphor sulfonate anion are exemplified.

As the carboxylate anions, e.g., an aliphatic carboxylate anion, an aromatic carboxylate anion and an aralkylcarboxylate anion are exemplified.

The aliphatic moiety in the aliphatic sulfonate anion may be an alkyl group or a cycloalkyl group, preferably an alkyl group having from 1 to 30 carbon atoms and a cycloalkyl group having from 3 to 30 carbon atoms, e.g., a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbonyl group, and a boronyl group are exemplified.

The aromatic group in the aromatic sulfonate anion is preferably an aryl group having from 6 to 14 carbon atoms, e.g., a phenyl group, a tolyl group, and a naphthyl group are exemplified.

The alkyl group, cycloalkyl group and aryl group in the aliphatic sulfonate anion and aromatic sulfonate anion may each have a substituent. As the substituents of the alkyl group, cycloalkyl group and aryl group in the aliphatic sulfonate anion and aromatic sulfonate anion, e.g., a nitro group, a halogen atom (a fluorine atom, a chlorine atom, a bromine atom, and an iodine atom), a carboxyl group, a hydroxyl group, an amino group, a cyano group, an alkoxyl group (preferably having from 1 to 5 carbon atoms), a cycloalkyl group (preferably having from 3 to 15 carbon atoms), an aryl group (preferably having from 6 to 14 carbon atoms), an alkoxycarbonyl group (preferably having from 2 to 7 carbon atoms), an acyl group (preferably having from 2 to 12 carbon atoms), and an alkoxycarbonyloxy group (preferably having from 2 to 7 carbon atoms) are exemplified. As for the aryl group and the cyclic structure of each group, an alkyl group (preferably having from 1 to 15 carbon atoms) can further be exemplified as the substituent.

As the aliphatic moiety in the aliphatic carboxylate anion, the same alkyl groups and cycloalkyl groups as in the aliphatic sulfonate anion can be exemplified.

As the aromatic group in the aromatic carboxylate anion, the same aryl groups as in the aromatic sulfonate anion can be exemplified.

As the aralkyl group in the aralkylcarboxylate anion, preferably an aralkyl group having from 6 to 12 carbon atoms, e.g., a benzyl group, a phenethyl group, a naphthylmethyl group, and a naphthylethyl group can be exemplified.

The alkyl group, cycloalkyl group, aryl group and aralkyl group in the aliphatic carboxylate anion, aromatic carboxylate anion and aralkylcarboxylate anion may have a substituent. As the substituents of the alkyl group, cycloalkyl group, aryl group and aralkyl group in the aliphatic carboxylate anion, aromatic carboxylate anion and aralkylcarboxylate anion, e.g., the same halogen atom, alkyl group, cycloalkyl group, alkoxyl group and alkylthio group as in the aromatic sulfonate anion can be exemplified.

As the sulfonylimide anion, e.g., a saccharin anion can be exemplified.

The alkyl group in the bis(alkylsulfonyl)imide anion and tris(alkylsulfonyl)-methyl anion is preferably an alkyl group having from 1 to 5 carbon atoms, e.g., a methyl group, an ethyl group, a propyl group, an isopropyl group, an n-butyl group, an isobutyl group, a sec-butyl group, a pentyl group, and a neopentyl group are exemplified. As the substituents of these alkyl groups, a halogen atom, an alkyl group substituted with a halogen atom, an alkoxyl group, and an alkylthio group can be exemplified, and an alkyl group substituted with a fluorine atom is preferred.

As other non-nucleophilic anions, e.g., fluorinated phosphorus, fluorinated boron and fluorinated antimony can be exemplified.

As the non-nucleophilic anions represented by $Z^-$, an aliphatic sulfonate anion in which the α-position of the sulfonic acid is substituted with a fluorine atom, an aromatic sulfonate anion substituted with a fluorine atom or a group having a fluorine atom, a bis(alkylsulfonyl)imide anion having an alkyl group substituted with a fluorine atom, and a tris(alkylsulfonyl)methide anion having an alkyl group substituted with a fluorine atom are preferred. More preferred non-nucleophilic anions are an aliphatic perfluorosufonate anion having from 4 to 8 carbon atoms, and a benzenesulfonate anion having a fluorine atom, and still more preferred non-nucleophilic anions are a nonafluorobutanesulfonate anion, a perfluorooctanesulfonate anion, a pentafluoro-benzenesulfonate anion, and a 3,5-bis(trifluoromethyl)benzenesulfonate anion.

As the examples of the organic groups represented by $R_{201}$, $R_{202}$ and $R_{203}$, the corresponding groups in the later-described compounds represented by formula (ZI-1), (ZI-2) or (ZI-3) can be exemplified.

The compound represented by formula (ZI) may be a compound having a plurality of structures represented by formula (ZI). For instance, compound (ZI) may be a compound having a structure that at least one of $R_{201}$, $R_{202}$ and $R_{203}$ of a compound represented by formula (ZI) is bonded to at least one of $R_{201}$, $R_{202}$ and $R_{203}$ of another compound represented by formula (ZI).

The following compounds (ZI-1), (ZI-2) and (ZI-3) can be exemplified as more preferred components (ZI).

Compound (ZI-1) is an arylsulfonium compound that at least one of $R_{201}$ to $R_{203}$ in formula (ZI) represents an aryl group, i.e., a compound having arylsulfonium as a cation.

All of $R_{201}$ to $R_{203}$ of the arylsulfonium compound may be aryl groups, or a part of $R_{201}$ to $R_{203}$ may be an aryl group and the remainder may be an alkyl group or a cycloalkyl group.

As the arylsulfonium compounds, e.g., a triarylsulfonium compound, a diarylalkylsulfonium compound, an aryldialkylsulfonium compound, a diarylcyclo-alkylsulfonium compound, and an aryldicycloalkylsulfonium compound are exemplified.

As the aryl groups of the arylsulfonium compound, a phenyl group and a naphthyl group are preferred, and the more preferred group is a phenyl group. The aryl group may be an aryl group having a heterocyclic structure having an oxygen atom, a nitrogen atom or a sulfur atom. As the aryl group having a heterocyclic structure, e.g., a pyrrole residue (a group formed by eliminating one hydrogen atom from pyrrole), a furan residue (a group formed by eliminating one hydrogen atom from furan), a thiophene residue (a group formed by eliminating one hydrogen atom from thiophene), an indole residue (a group formed by eliminating one hydrogen atom from indole), a benzofuran residue (a group formed by eliminating one hydrogen atom from benzofuran), and a benzothiophene residue (a group formed by eliminating one hydrogen atom from benzothiophene) can be exemplified. When the arylsulfonium compound has two or more aryl groups, these two or more aryl groups may be the same or different.

As the alkyl group or the cycloalkyl group that the arylsulfonium compound has according to necessity, a straight chain or branched alkyl group having from 1 to 15 carbon atoms and a cycloalkyl group having from 3 to 15 carbon atoms are preferred, e.g., a methyl group, an ethyl group, a propyl group, an n-butyl group, a sec-butyl group, a t-butyl group, a cyclopropyl group, a cyclobutyl group and a cyclohexyl group can be exemplified.

The aryl group, alkyl group and cycloalkyl group represented by $R_{201}$, $R_{202}$ and $R_{203}$ may have a substituent and, e.g., an alkyl group (e.g., having from 1 to 15 carbon atoms), a cycloalkyl group (e.g., having from 3 to 15 carbon atoms), an aryl group (e.g., having from 6 to 14 carbon atoms), an alkoxyl group (e.g., having from 1 to 15 carbon atoms), a halogen atom, a hydroxyl group, and a phenylthio group are exemplified as the substituents. The preferred substituents are a straight chain or branched alkyl group having from 1 to 12 carbon atoms, a cycloalkyl group having from 3 to 12 carbon atoms, and a straight chain, branched or cyclic alkoxyl group having from 1 to 12 carbon atoms, and the more preferred substituents are an alkyl group having from 1 to 4 carbon atoms and an alkoxyl group having from 1 to 4 carbon atoms. The substituent may be substituted on any one of three of $R_{201}$ to $R_{203}$, or may be substituted on all of the three. When $R_{201}$, $R_{202}$ and $R_{203}$ each represents an aryl group, it is preferred that the substituent be substituted on the p-position of the aryl group.

Compound (ZI-2) will be described below.

Compound (ZI-2) is a compound in the case where each of $R_{201}$, $R_{202}$ and $R_{203}$ in formula (ZI) independently represents an organic group not containing an aromatic ring. The aromatic ring here also includes aromatic rings containing a hetero atom.

The organic groups not containing an aromatic ring represented by $R_{201}$ to $R_{203}$ generally have from 1 to 30 carbon atoms, and preferably from 1 to 20 carbon atoms.

$R_{201}$, $R_{202}$ and $R_{203}$ each preferably represents an alkyl group, a cycloalkyl group, an allyl group, or a vinyl group, more preferably a straight chain or branched 2-oxoalkyl group, a 2-oxocycloalkyl group or an alkoxycarbonylmethyl group, and especially preferably a straight or branched 2-oxoalkyl group.

The alkyl group and cycloalkyl group represented by $R_{201}$ to $R_{203}$ are preferably a straight chain or branched alkyl group having from 1 to 10 carbon atoms (e.g., a methyl group, an ethyl group, a propyl group, a butyl group, and a pentyl group), and a cycloalkyl group having from 3 to 10 carbon atoms (e.g., a cyclopentyl group, a cyclohexyl group, and a norbonyl group). The alkyl group is more preferably a 2-oxoalkyl group or an alkoxycarbonylmethyl group. The cycloalkyl group is more preferably a 2-oxocycloalkyl group.

The 2-oxoalkyl group may be either straight chain or branched, and a group having >C=O on the 2-position of the above alkyl group can be exemplified as a preferred group.

The 2-oxocycloalkyl group is preferably a group having >C=O on the 2-position of the above cycloalkyl group.

As the alkoxyl group in the alkoxycarbonylmethyl group, preferably an alkoxyl group having from 1 to 5 carbon atoms (e.g., a methoxy group, an ethoxy group, a propoxy group, a butoxy group, and a pentoxy group) can be exemplified.

$R_{201}$ to $R_{203}$ may further be substituted with a halogen atom, an alkoxyl group (e.g., having from 1 to 5 carbon atoms), a hydroxyl group, a cyano group, or a nitro group.

Compound (ZI-3) is a compound represented by the following formula (ZI-3), which compound has a phenacylsulfonium salt structure.

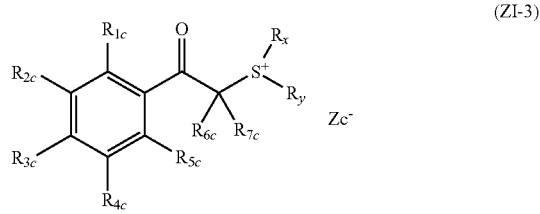

(ZI-3)

In formula (ZI-3), each of $R_{1c}$, $R_{2c}$, $R_{3c}$, $R_{4c}$ and $R_{5c}$ independently represents a hydrogen atom, an alkyl group, a cycloalkyl group, an alkoxyl group, or a halogen atom.

Each of $R_{6c}$ and $R_{7c}$ independently represents a hydrogen atom, an alkyl group or a cycloalkyl group.

Each of $R_x$ and $R_y$ independently represents an alkyl group, a cycloalkyl group, an allyl group, or a vinyl group.

Any two or more of $R_{1c}$ to $R_{5c}$, $R_{6c}$ and $R_{7c}$, and $R_x$ and $R_y$ may be bonded to each other to form cyclic structures respectively, and the cyclic structures may contain an oxygen atom, a sulfur atom, an ester bond, or an amido bond. As the groups formed by any two or more of $R_{1c}$ to $R_{5s}$, $R_{6c}$ and $R_{7c}$, and $R_x$ and $R_y$ by bonding, a butylene group, a pentylene group, etc., can be exemplified.

$Z_c^-$ represents a non-nucleophilic anion, and the same non-nucleophilic anions as represented by $Z^-$ in formula (ZI) can be exemplified.

The alkyl groups represented by $R_{1c}$ to $R_{7c}$ may be either straight chain or branched, e.g., an alkyl group having from 1 to 20 carbon atoms, preferably a straight chain or branched alkyl group having from 1 to 12 carbon atoms (e.g., a methyl group, an ethyl group, a straight chain or branched propyl group, a straight chain or branched butyl group, and a straight chain or branched pentyl group) can be exemplified. As the cycloalkyl groups represented by $R_{1c}$ to $R_{7c}$, a cycloalkyl group having from 3 to 8 carbon atoms (e.g., a cyclopentyl group and a cyclohexyl group) can be exemplified.

The alkoxyl groups represented by $R_{1c}$ to $R_{5c}$ may be any of straight chain, branched and cyclic, e.g., an alkoxyl group having from 1 to 10 carbon atoms, preferably a straight chain or branched alkoxyl group having from 1 to 5 carbon atoms (e.g., a methoxy group, an ethoxy group, a straight chain or branched propoxy group, a straight chain or branched butoxy group, a straight chain or branched pentoxy group), a cyclic alkoxyl group having from 3 to 8 carbon atoms (e.g., a cyclopentyloxy group, a cyclohexyloxy group) can be exemplified.

It is preferred that any of $R_{1c}$ to $R_{5c}$ represents a straight chain or branched alkyl group, a cycloalkyl group, or a straight chain, branched or cyclic alkoxyl group, it is more preferred that the sum total of the carbon atoms of $R_{1c}$ to $R_{5c}$ is from 2 to 15, by which the solubility in a solvent increases and generation of particles during preservation can be restrained.

As the alkyl group and cycloalkyl group represented by $R_x$ and $R_y$, the same alkyl groups and cycloalkyl groups represented by $R_{1c}$ to $R_{7c}$ can be exemplified, and a 2-oxoalkyl group, a 2-oxocycloalkyl group and an alkoxycarbonylmethyl group are more preferred.

As the 2-oxoalkyl group and the 2-oxocycloalkyl group, groups respectively having >C=O on the 2-position of the alkyl group and the cycloalkyl group represented by $R_{1c}$ to $R_{7c}$ can be exemplified.

As the alkoxyl group in the alkoxycarbonylmethyl group, the same alkoxyl groups as those represented by $R_{1c}$ to $R_{5c}$, can be exemplified.

Each of $R_x$ and $R_y$ preferably represents an alkyl group or a cycloalkyl group having 4 or more carbon atoms, more preferably 6 or more carbon atoms, and still more preferably an alkyl group or a cycloalkyl group having 8 or more carbon atoms.

In formulae (ZII) and (ZIII), each of $R_{204}$, $R_{205}$, $R_{206}$ and $R_{207}$ independently represents an aryl group, an alkyl group or a cycloalkyl group.

The aryl group represented by $R_{204}$ to $R_{207}$ is preferably a phenyl group or a naphthyl group, and more preferably a phenyl group. The aryl group represented by $R_{204}$ to $R_{207}$ may be an aryl group having a heterocyclic structure and having an oxygen atom, a nitrogen atom or a sulfur atom. As the aryl group having a heterocyclic structure, e.g., a pyrrole residue (a group formed by eliminating one hydrogen atom from pyrrole), a furan residue (a group formed by eliminating one hydrogen atom from furan), a thiophene residue (a group formed by eliminating one hydrogen atom from thiophene), an indole residue (a group formed by eliminating one hydrogen atom from indole), a benzofuran residue (a group formed by eliminating one hydrogen atom from benzofuran), and a benzothiophene residue (a group formed by eliminating one hydrogen atom from benzothiophene) can be exemplified.

The alkyl group and the cycloalkyl group represented by $R_{204}$ to $R_{207}$ are preferably a straight chain or branched alkyl group having from 1 to 10 carbon atoms (e.g., a methyl group, an ethyl group, a propyl group, a butyl group, a pentyl group), and a cycloalkyl group having from 3 to 10 carbon atoms (e.g., a cyclopentyl group, a cyclohexyl group, a norbonyl group).

The aryl group, alkyl group and cycloalkyl group represented by $R_{204}$ to $R_{207}$ may have a substituent. As the substituents that the aryl group, alkyl group and cycloalkyl group represented by $R_{204}$ to $R_{207}$ may have, e.g., an alkyl group (e.g., having from 1 to 15 carbon atoms), a cycloalkyl group (e.g., having from 3 to 15 carbon atoms), an aryl group (e.g., having from 6 to 15 carbon atoms), an alkoxyl group (e.g., having from 1 to 15 carbon atoms), a halogen atom, a hydroxyl group, and a phenylthio group can be exemplified.

$Z^-$ represents a non-nucleophilic anion, and the same non-nucleophilic anions as those represented by $Z^-$ in formula (ZI) can be exemplified.

As the compounds capable of generating an acid upon irradiation with actinic ray or radiation usable in the invention, the compounds represented by the following formula (ZIV), (ZV) or (ZVI) can further be exemplified.

$$Ar_3-SO_2-SO_2-Ar_4 \quad \text{ZIV}$$

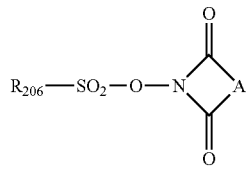

ZV

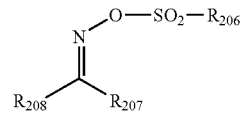

ZVI

In formulae (ZIV), (ZV) and (ZVI), each of $Ar_3$ and $Ar_4$ independently represents an aryl group.

Each of $R_{206}$, $R_{207}$ and $R_{208}$ independently represents an alkyl group, a cycloalkyl group or an aryl group.

A represents an alkylene group, an alkenylene group or an arylene group.

Of the compounds capable of generating an acid upon irradiation with actinic ray or radiation, more preferred compounds are the compounds represented by formulae (ZI), (ZII) and (ZIII).

Further, as the compounds capable of generating an acid upon irradiation with an actinic ray or radiation, a compound capable of generating an acid having one sulfonic acid group or imido group is preferred, a compound capable of generating a monovalent perfluoroalkanesulfonic acid, a compound capable of generating an aromatic sulfonic acid substituted with a monovalent fluorine atom or a group containing a fluorine atom, and a compound capable of generating an imidic acid substituted with a monovalent fluorine atom or a group containing a fluorine atom are more preferred, and a sulfonium salt of a fluoride-substituted alkanesulfonic acid, a fluorine-substituted benzenesulfonic acid, or a fluorine-substituted imidic acid is still more preferred. The usable acid generators are especially preferably a fluoride-substituted alkanesulfonic acid, a fluoride-substituted benzenesulfonic acid, and a fluoride-substituted imidic acid each having pKa of generated acid of −1 or less are especially preferred, by which sensitivity is improved.

Of the compounds capable of generating an acid upon irradiation with actinic ray or radiation, especially preferred examples are shown below.

(z1)

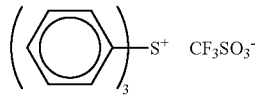 $CF_3SO_3^-$ (z2)

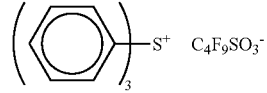 $C_4F_9SO_3^-$ (z3)

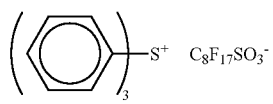 $C_8F_{17}SO_3^-$ (z4)

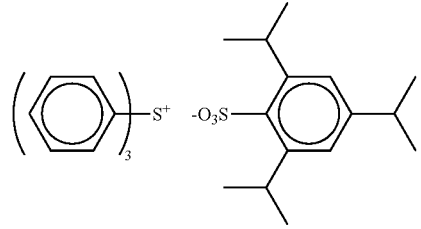

-continued
(z5) 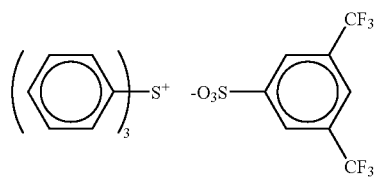
(z6) 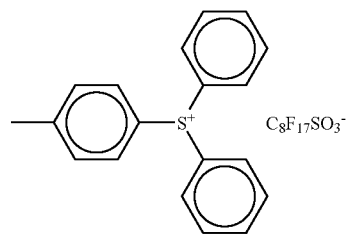
(z7) 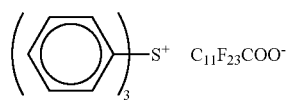
(z8) 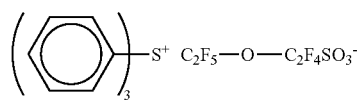
(z9) 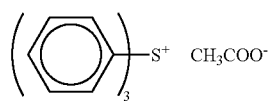
(z10) 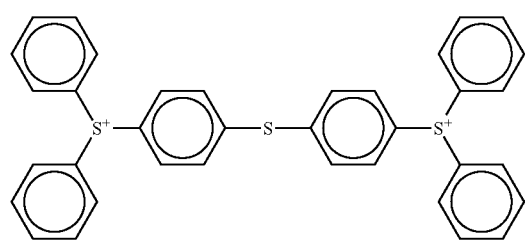
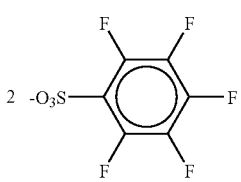
(z11) 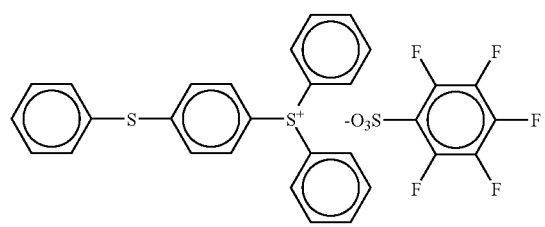
(z12) 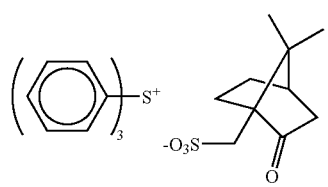
(z13) 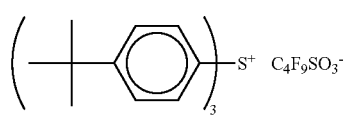
(z14) 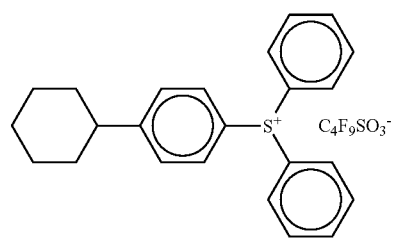
(z15) 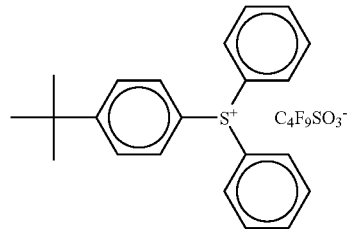
(z16) 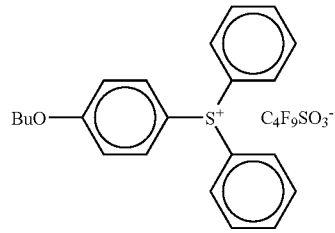
(z17) 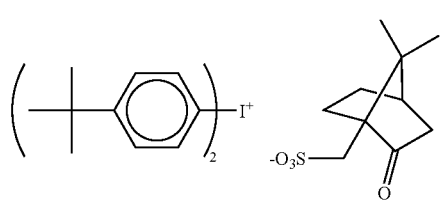
(z18) 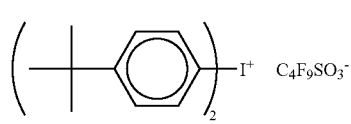

-continued
(z19) 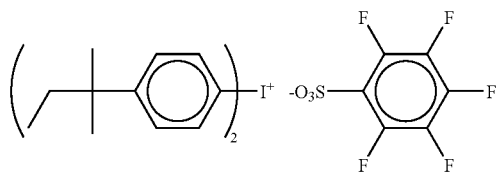 (z20) 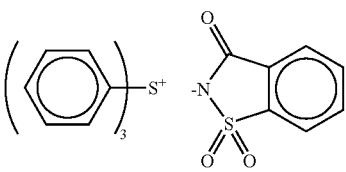
(z21)  (z22) 
(z23) 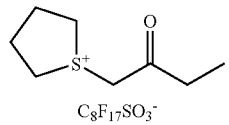 (z24) 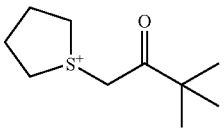
(z25)  (z26) 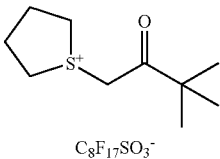
(z27) 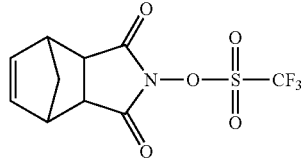 (z28) 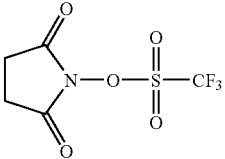
(z29) 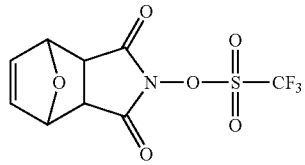 (z30) 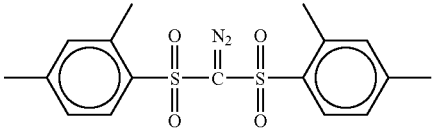
(z31) 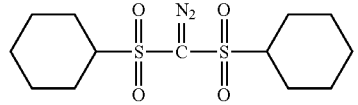 (z32) 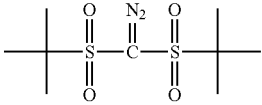
(z33) 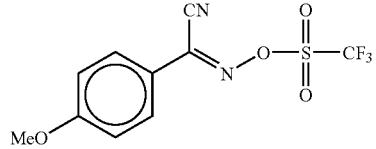
(z34) 
(z35) 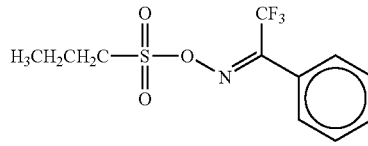 (z36) 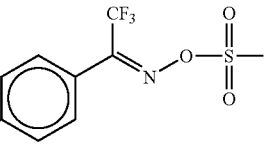

-continued
(z37) 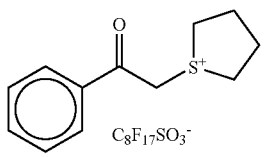
(z38) 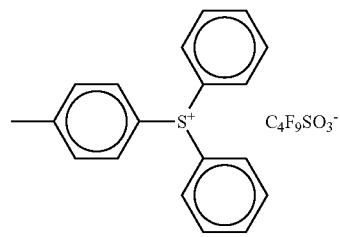
(z39) 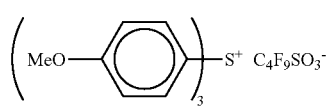
(z40) 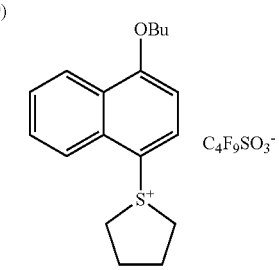
(z41) 
(z42) 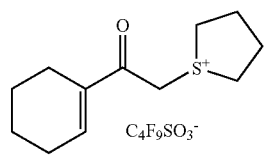
(z43) 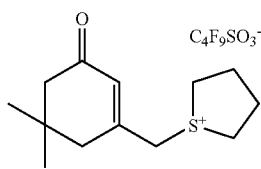
(z44) 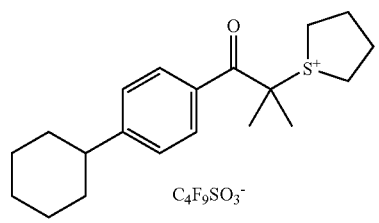
(z45) 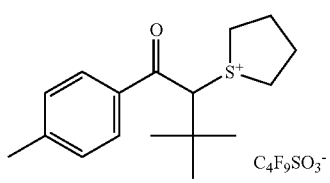
(z46) 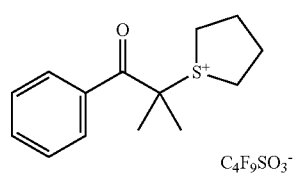
(z47) 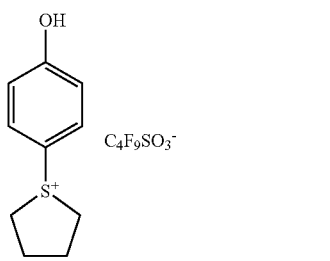
(z48) 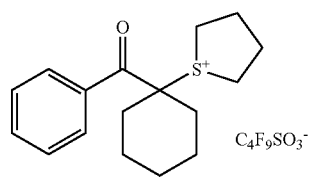
(z49) 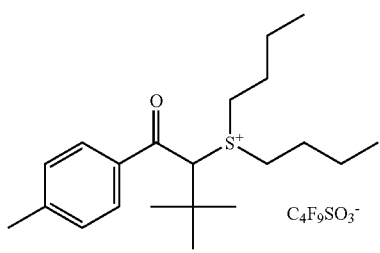
(z50) 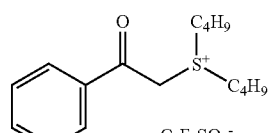

-continued

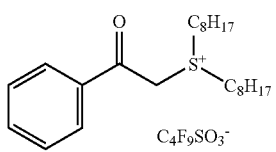
(z51)

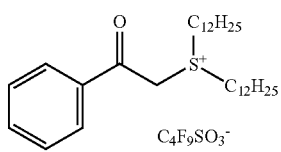
(z52)

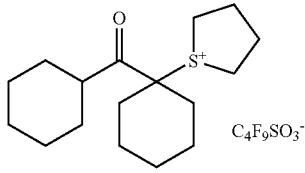
(z53)

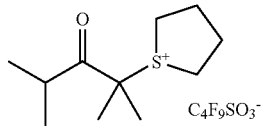
(z54)

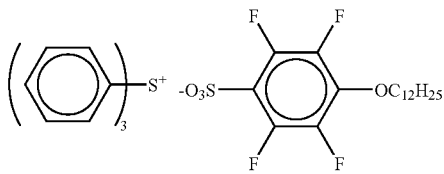
(z55)

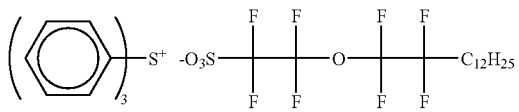
(z56)

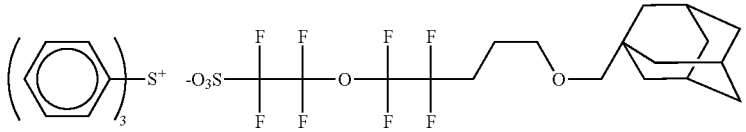
(z57)

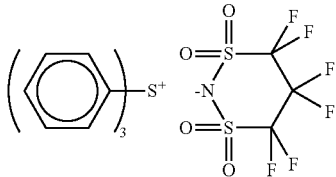
(z58)

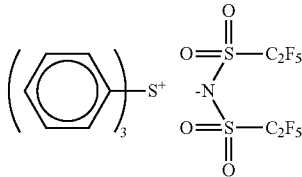
(z59)

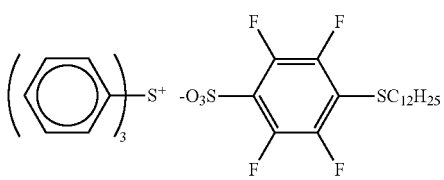
(z60)

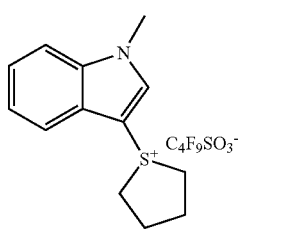
(z61)

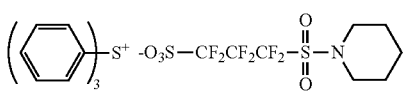
(z62)

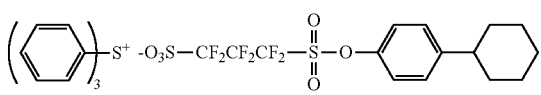
(z63)

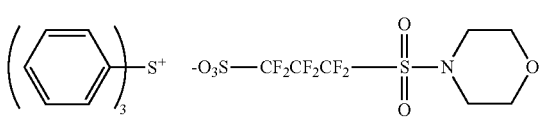
(z64)

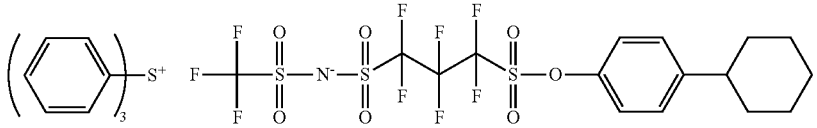
(z65)

Acid generator A2 can also be used by one kind alone or in combination two or more.

The amount of acid generator A2 is preferably 50 mass % or less to acid generator A1, and more preferably 30 mass % or less.

[3] Resin (B) Capable of Decomposing by the Action of an Acid to Increase Solubility in an Alkali Developing Solution:

A resin capable of decomposing by the action of an acid to increase solubility in an alkali developing solution contained in a resist composition in the invention has a repeating unit represented by the following formula (II) and a repeating unit represented by the following formula (III).

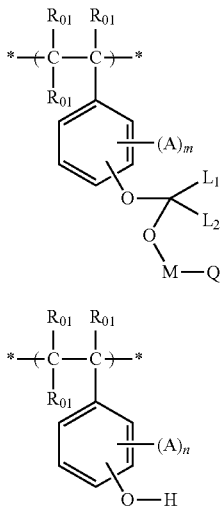

In formulae (II) and (III), $R_{01}$ represents a hydrogen atom, an alkyl group, a cycloalkyl group, a halogen atom, a cyano group, or an alkoxycarbonyl group.

$L_1$ and $L_2$, which may be the same or different, each represents a hydrogen atom, an alkyl group, a cycloalkyl group, or an aralkyl group.

M represents a single bond or a divalent linking group.

Q represents an alkyl group, a cycloalkyl group, or an alicyclic group or an aromatic ring group that may contain a hetero atom.

At least two of Q, M and $L_1$ may be bonded to each other to form a 5- or 6-membered ring.

A represents a halogen atom, a cyano group, an acyl group, an alkyl group, an alkoxyl group, an acyloxy group, or an alkoxycarbonyl group.

Each of m and n independently represents an integer of from 1 to 4, provided that m and n do not represent 0 at the same time.

Resin (B) capable of decomposing by the action of an acid to increase solubility in an alkali developing solution may be a resin having a repeating unit represented by formula (II), a repeating unit represented by formula (III), and a repeating unit represented by formula (IV). In this case, both of m and n may be 0 at the same time.

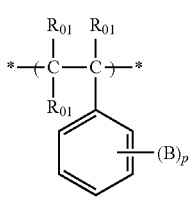

In formula (IV), $R_{01}$ represents a hydrogen atom, an alkyl group, a cycloalkyl group, a halogen atom, a cyano group, or an alkoxycarbonyl group.

B represents a halogen atom, a cyano group, an acyl group, an alkyl group, an alkoxyl group, an acyloxy group, or an alkoxycarbonyl group.

p represents an integer of from 0 to 5.

The substituent of the benzene ring in the repeating unit represented by formula (II) is a group capable of decomposing by the action of an acid to generate a hydroxyl group (an alkali-soluble group) (an acid-decomposable group), which is decomposed by the action of an acid to generate a hydroxystyrene unit, and makes the resin capable of increasing the solubility in an alkali developing solution.

In formula (IV), $R_{01}$ represents a hydrogen atom, an alkyl group, a cycloalkyl group, a halogen atom, a cyano group, or an alkoxycarbonyl group, and carbon atom number is preferably 20 or less.

The alkyl group or the cycloalkyl group represented by $R_{01}$ preferably has 20 or less carbon atom, e.g., a methyl group, an ethyl group, a propyl group, an isopropyl group, an n-butyl group, an isobutyl group, a t-butyl group, a pentyl group, a cyclopentyl group, a hexyl group, a cyclohexyl group, an octyl group, and a dodecyl group are exemplified. These groups may each have a substituent, e.g., an alkoxyl group, a hydroxyl group, a halogen atom, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group, and a heterocyclic residue such as a pyrrolidone residue are exemplified as the substituents, and these groups preferably have 8 or less carbon atoms. A $CF_3$ group, an alkoxycarbonylmethyl group, an alkylcarbonyloxymethyl group, a hydroxymethyl group, and an alkoxymethyl group are more preferred.

As the halogen atom represented by $R_{01}$, a fluorine atom, a chlorine atom, a bromine atom and an iodine atom are exemplified, and a fluorine atom is preferred.

As the alkyl group contained in the alkoxycarbonyl group represented by $R_{01}$, the same alkyl groups as those represented by $R_{01}$ are preferably exemplified.

The alkyl group represented by $L_1$ and $L_2$ is, e.g., an alkyl group having from 1 to 8 carbon atoms, and specifically a methyl group, an ethyl group, a propyl group, an n-butyl group, a sec-butyl group, a hexyl group, and an octyl group are preferably exemplified.

The cycloalkyl group represented by $L_1$ and $L_2$ is, e.g., a cycloalkyl group having from 3 to 15 carbon atoms, and specifically a cyclopentyl group, a cyclohexyl group, a norbornyl group, and an adamantyl group are preferably exemplified.

The aryl group represented by $L_1$ and $L_2$ is, e.g., an aryl group having from 6 to 15 carbon atoms, and specifically a phenyl group, a tolyl group, a naphthyl group, and an anthryl group are preferably exemplified.

The aralkyl group represented by $L_1$ and $L_2$ is, e.g., an aralkyl group having from 6 to 20 carbon atoms, and a benzyl group and a phenethyl group are exemplified.

The divalent linking group represented by M is, e.g., an alkylene group, a cycloalkylene group, an alkenylene group, an arylene group, —OCO—, —COO—, —CON($R_0$)—, and a linking group containing a plurality of these groups. $R_0$ represents a hydrogen atom or an alkyl group.

The alkyl group and the cycloalkyl group represented by Q are the same as the alkyl group and the cycloalkyl group represented by $L_1$ and $L_2$.

As the alicyclic group or the aromatic ring group that may contain a hetero atom represented by Q, the cycloalkyl group and the aryl group represented by $L_1$ and $L_2$ are exemplified, and they preferably have from 3 to 15 carbon atoms.

As the alicyclic group or the aromatic ring group containing a hetero atom, thiirane, cyclothiolane, thiophene, furan, pyrrole, benzothiophene, benzofuran, benzopyrrole, triazine, imidazole, benzimidazole, triazole, thiadiazole, thiazole and pyrrolidone are exemplified. However, the alicyclic group or the aromatic ring group containing a hetero atom are not restricted to these compounds, so long as they have a structure generally called a heterocyclic ring (a ring formed by carbon atoms and hetero atoms, or a ring formed by hetero atoms).

As the 5- or 6-membered ring formed by at least two of Q, M and $L_1$, a case where at least two of Q, M and $L_1$ are bonded to each other to form, e.g., a propylene group or a butylene group, and a 5- or 6-membered ring containing an oxygen atom is formed is exemplified.

The group represented by -M-Q preferably has from 1 to 30 carbon atoms, and more preferably from 5 to 20 carbon atoms, and as the group represented by $—OC(L_1)(L_2)O\text{-}M\text{-}Q$, the following groups are exemplified.

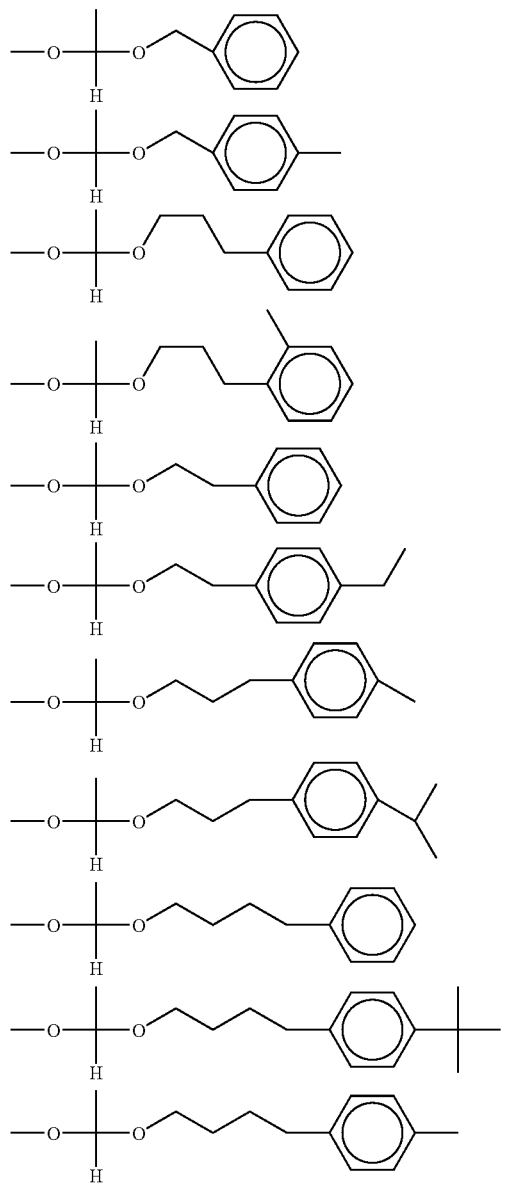

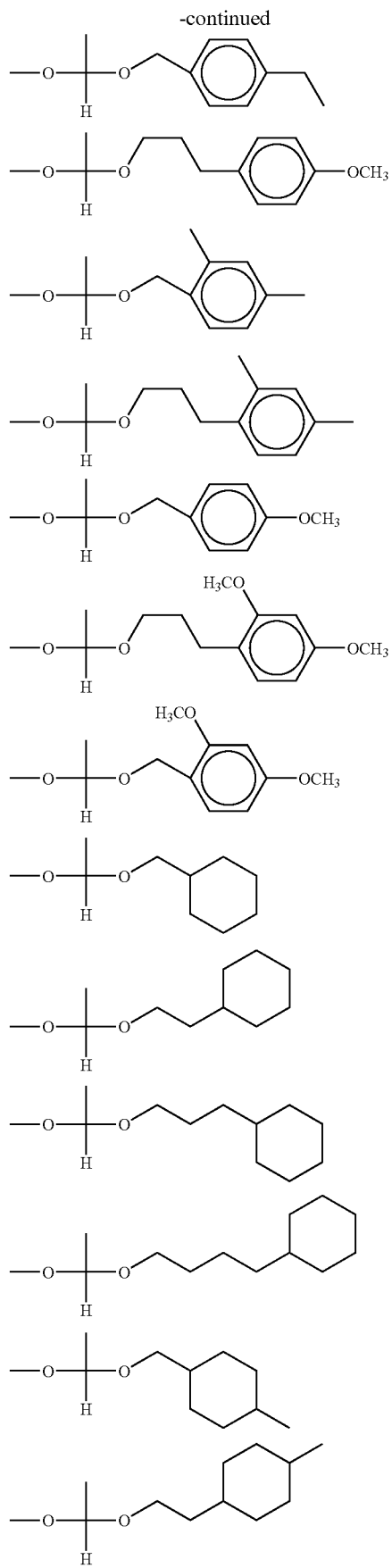

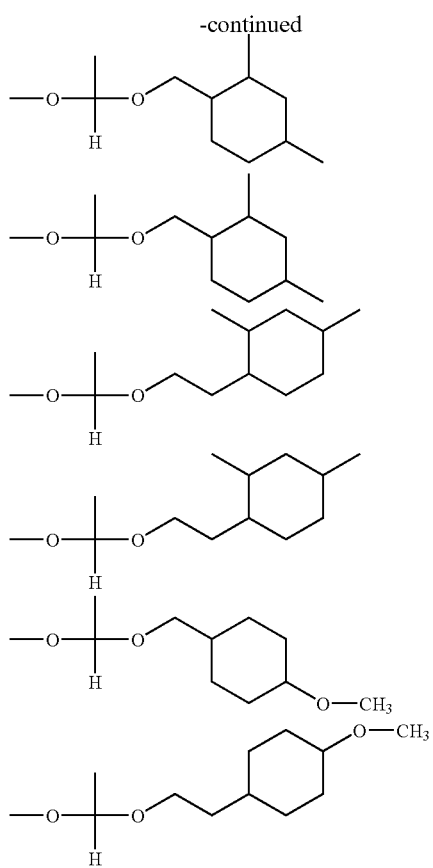

The acyl group represented by A is, e.g., an acyl group having from 2 to 8 carbon atoms, and specifically a formyl group, an acetyl group, a propanoyl group, a butanoyl group, a pivaloyl group, and a benzoyl group are preferably exemplified.

The alkyl group represented by A is, e.g., an alkyl group having from 1 to 8 carbon atoms, and specifically a methyl group, an ethyl group, a propyl group, an n-butyl group, a sec-butyl group, a hexyl group, and an octyl group can be preferably exemplified.

The alkoxyl group represented by A is, e.g., an alkoxyl group having from 1 to 8 carbon atoms, and a methoxy group, an ethoxy group, a propoxy group, a butoxy group, a pentyloxy group, a hexyloxy group, and a cyclohexyloxy group can be exemplified.

As the acyloxy group or an alkoxycarbonyl group represented by A, the groups corresponding to the above acyl group and alkoxyl group can be exemplified.

A preferably represents an acyl group, an alkoxyl group, an acyloxy group or an alkoxycarbonyl group, and more preferably an acyloxy group or an alkoxycarbonyl group Each of the above groups may have a substituent, and as the examples of preferred substituents, a hydroxyl group, a carboxyl group, a halogen atom (e.g., a fluorine atom, a chlorine atom, a bromine atom and an iodine atom), an alkoxyl group (e.g., a methoxy group, an ethoxy group, a propoxy group, and a butoxy group) can be exemplified. In connection with the cyclic structure, an alkoxyl group (preferably having from 1 to 8 carbon atoms) can further be exemplified as a substituent.

Each of m and n independently represents an integer of from 0 to 4, preferably from 0 to 2, and more preferably 1.

The specific examples of the repeating units represented by formula (II) are shown below, but the invention is not restricted thereto.

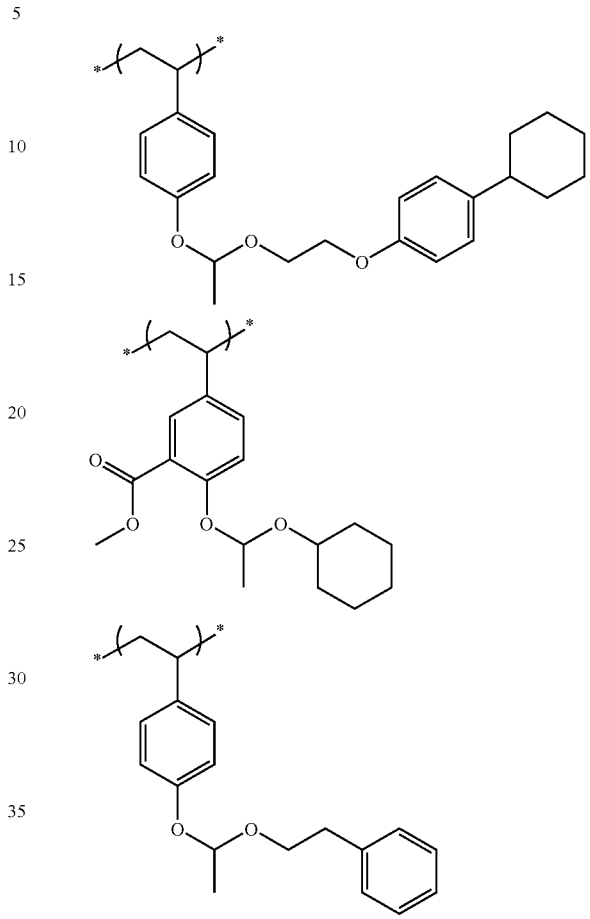

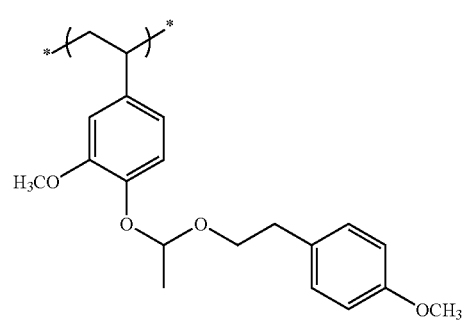

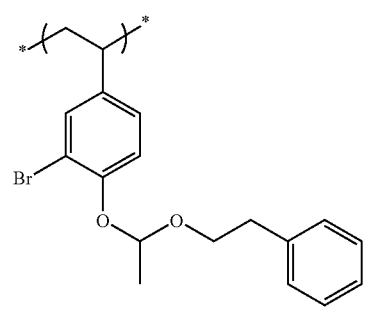

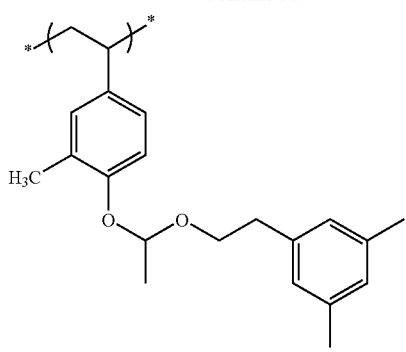
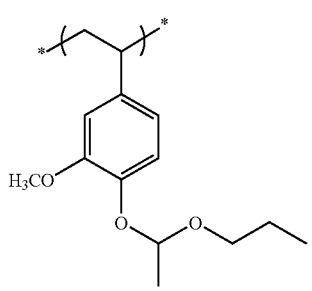
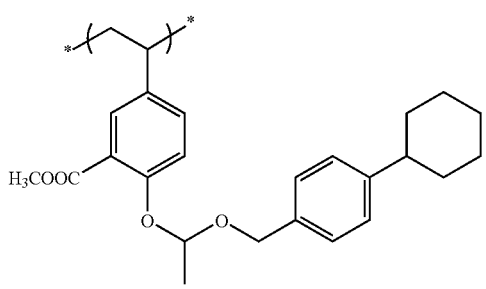
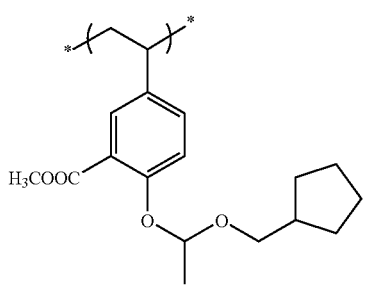
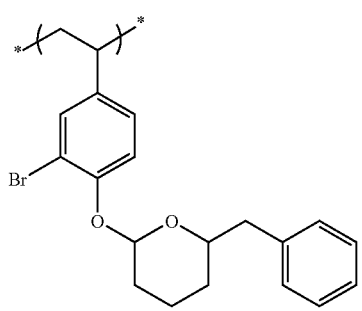
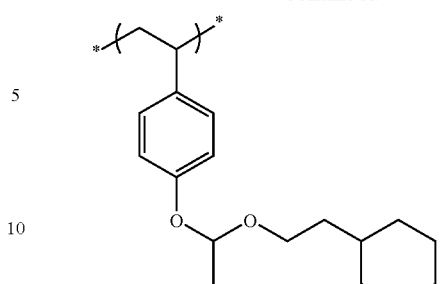
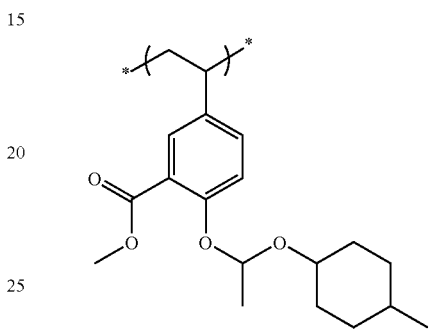
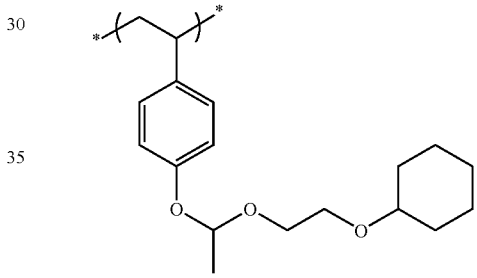
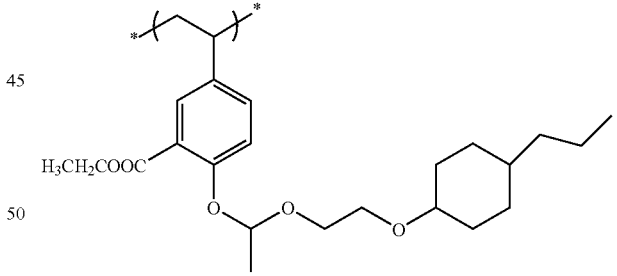
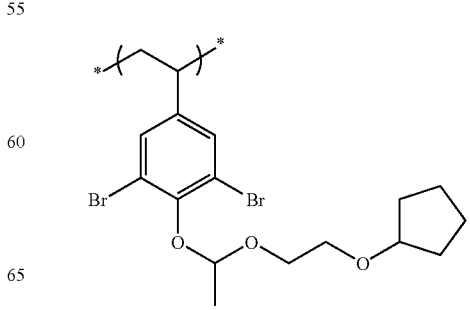

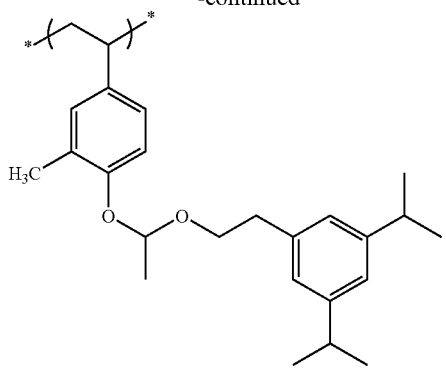
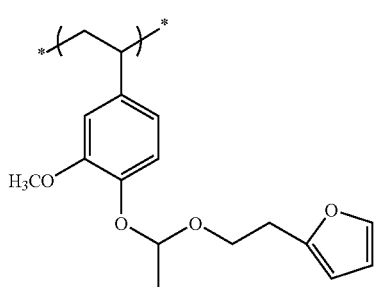
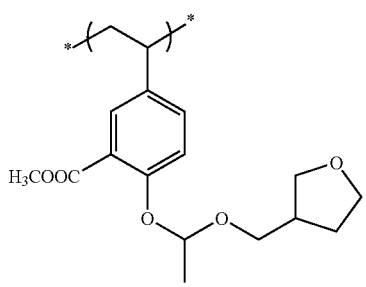
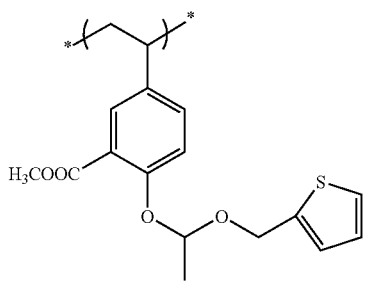
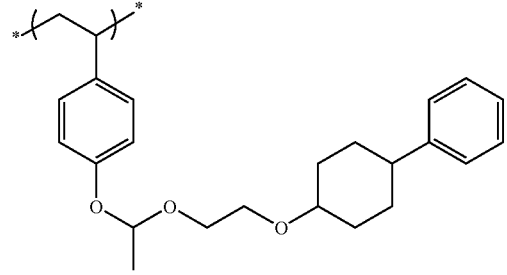

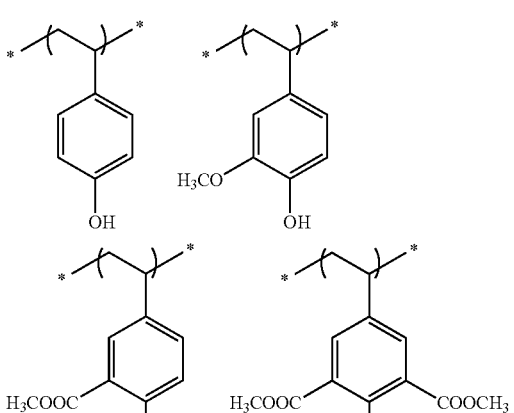
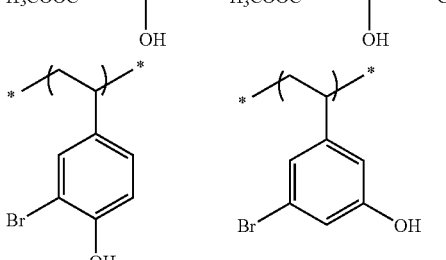
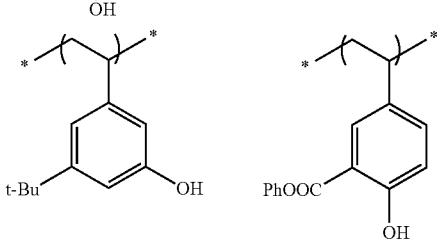
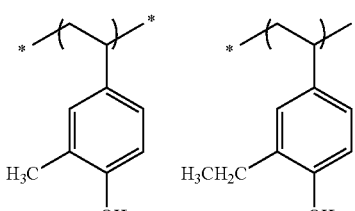
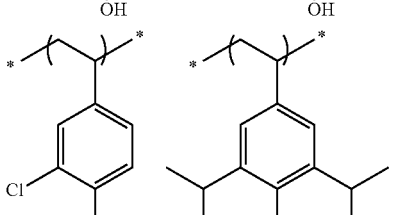
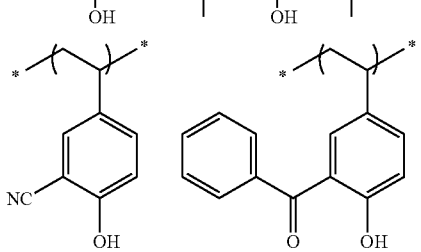

The specific examples of the repeating units represented by formula (III) are shown below, but the invention is not restricted thereto.

$R_{01}$ in formula (IV) represents a hydrogen atom, an alkyl group, a cycloalkyl group, a halogen atom, a cyano group, or an alkoxycarbonyl group, and preferably has 20 or less carbon atoms. $R_{01}$ in formula (IV) has the same meaning as $R_{01}$ in formula (II) or (III).

B preferably represents an acyl group, an alkoxyl group, an acyloxy group or an alkoxycarbonyl group, and more preferably an acyloxy group or an alkoxycarbonyl group.

p represents an integer of from 1 to 5, preferably from 0 to 2, and more preferably 1.

The specific examples of the repeating units represented by formula (IV) are shown below, but the invention is not restricted thereto.

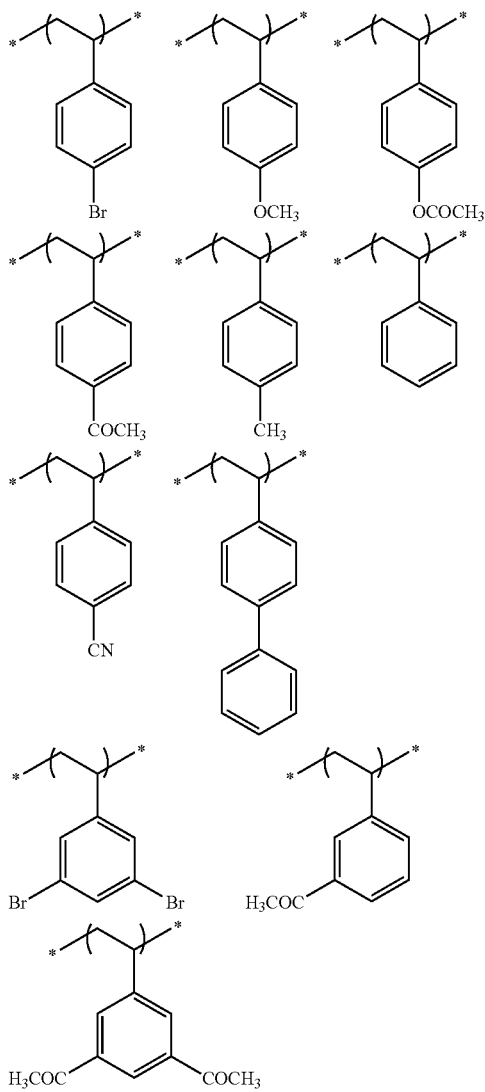

Resin (B) may have a repeating unit represented by the following formula (V).

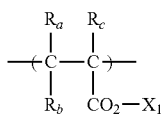

(V)

In formula (V), each of $R_a$, $R_b$ and $R_c$ independently represents a hydrogen atom, a fluorine atom, a chlorine atom, a cyano group or an alkyl group.

$X_1$ represents a hydrogen atom or an organic group.

The alkyl group represented by $R_a$ to $R_c$ is preferably an alkyl group having from 1 to 5 carbon atoms, e.g., a methyl group, an ethyl group and a propyl group can be exemplified.

The organic group represented by $X_1$ preferably has from 1 to 40 carbon atoms, which may be an acid-decomposable group or a non-acid-decomposable group.

As the non-acid-decomposable group, the same groups as represented A in formula (II) except for a halogen atom are exemplified. Also, an alkyl group, a cycloalkyl group, an alkenyl group, an aryl group, an alkyloxy group (excluding an —O-tertiary alkyl group), an acyl group, a cycloalkyloxy group, an alkenyloxy group, an aryloxy group, an alkylcarbonyloxy group, an alkylamidomethyloxy group, an alkylamido group, an arylamidomethyl group, and an arylamido group are exemplified.

As the non-acid-decomposable group, preferably an acyl group, an alkylcarbonyloxy group, an alkyloxy group, a cycloalkyloxy group, an aryloxy group, an alkylamidoxy group, and an alkylamido group are exemplified, and more preferably an acyl group, an alkylcarbonyloxy group, an alkyloxy group, a cycloalkyloxy group, and an aryloxy group are exemplified.

As the alkyl group in the non-acid-decomposable group, an alkyl group having from 1 to 4 carbon atoms, e.g., a methyl group, an ethyl group, a propyl group, an n-butyl group, a sec-butyl group, and a t-butyl group are preferred. As the cycloalkyl group, a cycloalkyl group having from 3 to 10 carbon atoms, e.g., a cyclopropyl group, a cyclobutyl group, a cyclohexyl group, and an adamantyl group are preferred. As the alkenyl group, an alkenyl group having from 2 to 4 carbon atoms, e.g., a vinyl group, a propenyl group, an allyl group, and a butenyl group are preferred. As the aryl group, an aryl group having from 6 to 14 carbon atoms, e.g., a phenyl group, a xylyl group, a toluoyl group, a cumenyl group, a naphthyl group, and an anthracenyl group are preferred. As the alkoxyl group, an alkoxyl group having from 1 to 4 carbon atoms, e.g., a methoxy group, an ethoxy group, a hydroxyethoxy group, a propoxy group, a hydroxypropoxy group, an n-butoxy group, an isobutoxy group, and a sec-butoxy group are preferred.

As the organic group of the acid-decomposable groups represented by $X_1$, e.g., —$C(R_{11a})(R_{12a})(R_{13a})$, —$C(R_{14a})(R_{15a})(OR_{16a})$, and —CO—OC$(R_{1a})(R_{12a})(R_{13a})$ can be exemplified.

Each of $R_{11a}$ to $R_{13a}$ independently represents an alkyl group, a cycloalkyl group, an alkenyl group, an aralkyl group or an aryl group. Each of $R_{14a}$ and $R_{15a}$ independently represents a hydrogen atom or an alkyl group. $R_{16a}$ represents an alkyl group, a cycloalkyl group, an alkenyl group, an aralkyl group or an aryl group. Further, two of $R_{11a}$, $R_{12a}$ and $R_{13a}$, or two of $R_{14a}$, $R_{15a}$ and $R_{16a}$ may be bonded to each other to form a ring.

A group having an acid-decomposable group can also be introduced into $X_1$ by modification. $X_1$ to which an acid-decomposable group is introduced is, for example, as follows.

—[$C(R_{17a})(R_{18a})]_p$—CO—OC$(R_{11a})(R_{12a})(R_{13a})$, wherein each of $R_{17a}$ and $R_{18a}$ independently represents a hydrogen atom or an alkyl group; and p represents an integer of from 1 to 4.

The organic group represented by $X_1$ is preferably an acid-decomposable group having at least one cyclic structure selected from an alicyclic structure, an aromatic structure, and a bridged alicyclic structure, a structure containing an aromatic group (in particular, a phenyl group), or a structure containing an alicyclic or bridged alicyclic structure represented by any of the following formulae (pI) to (pVI).

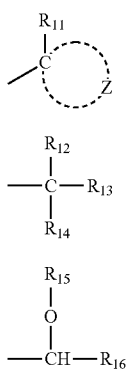 (pI)

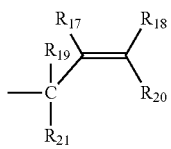 (pII)

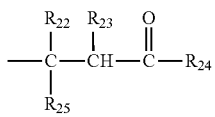 (pIII)

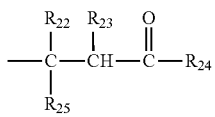 (pIV)

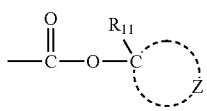 (pV)

 (pVI)

In formulae (pI) to (pVI), $R_{11}$ represents a methyl group, an ethyl group, an n-propyl group, an isopropyl group, an n-butyl group, an isobutyl group, or a sec-butyl group; and Z represents an atomic group necessary to form an alicyclic hydrocarbon group together with a carbon atom.

Each of $R_{12}$, $R_{13}$, $R_{14}$, $R_{15}$ and $R_{16}$ independently represents a straight chain or branched alkyl group having from 1 to 4 carbon atoms, or an alicyclic hydrocarbon group, provided that at least one of $R_{12}$ to $R_{14}$, or either $R_{15}$ or $R_{16}$ represents an alicyclic hydrocarbon group.

Each of $R_{17}$, $R_{18}$, $R_{19}$, $R_{20}$ and $R_{21}$ independently represents a hydrogen atom, a straight chain or branched alkyl group having from 1 to 4 carbon atoms, or an alicyclic hydrocarbon group, provided that at least one of $R_{17}$ to $R_{21}$ represents an alicyclic hydrocarbon group, and either $R_{19}$ or $R_{21}$ represents a straight chain or branched alkyl group having from 1 to 4 carbon atoms, or an alicyclic hydrocarbon group.

Each of $R_{22}$, $R_{23}$, $R_{24}$ and $R_{25}$ independently represents a hydrogen atom, a straight chain or branched alkyl group having from 1 to 4 carbon atoms, or an alicyclic hydrocarbon group, provided that at least one of $R_{22}$ to $R_{25}$ represents an alicyclic hydrocarbon group, and $R_{23}$ and $R_{24}$ may be bonded to each other to form a ring.

In formulae (pI) to (pVI), the alkyl group represented by $R_{12}$ to $R_{25}$ is a straight chain or branched alkyl group having from 1 to 4 carbon atoms which may be substituted or unsubstituted, e.g., a methyl group, an ethyl group, an n-propyl group, an isopropyl group, an n-butyl group, an isobutyl group, a sec-butyl group, and a t-butyl group are exemplified.

As the examples of further substituents of the alkyl group, an alkoxyl group having from 1 to 4 carbon atoms, a halogen atom (a fluorine atom, a chlorine ion, a bromine ion, an iodine ion), an acyl group, an acyloxy group, a cyano group, a hydroxyl group, a carboxyl group, an alkoxycarbonyl group, and a nitro group can be exemplified.

The alicyclic hydrocarbon groups represented by $R_{11}$ to $R_{25}$ or the alicyclic hydrocarbon group formed by Z together with carbon atoms may be monocyclic or polycyclic. Specifically, groups having a monocyclic, bicyclic, tricyclic or tetracyclic structure having 5 or more carbon atoms can be exemplified. The number of carbon atoms of these alicyclic hydrocarbon groups is preferably from 6 to 30, and especially preferably from 7 to 25. These alicyclic hydrocarbon groups may have a substituent.

The examples of the structures of alicyclic moiety of the alicyclic hydrocarbon groups are shown below.

 (1)

 (2)

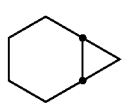 (3)

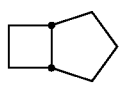 (4)

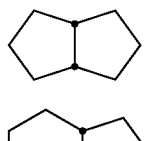 (5)

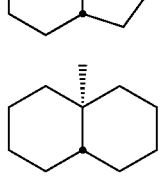 (6)

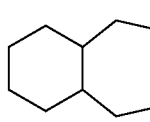 (7)

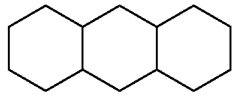 (8)

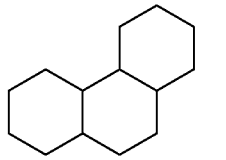 (9)

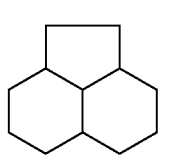 (10)

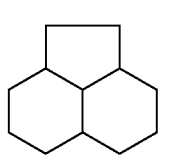 (11)

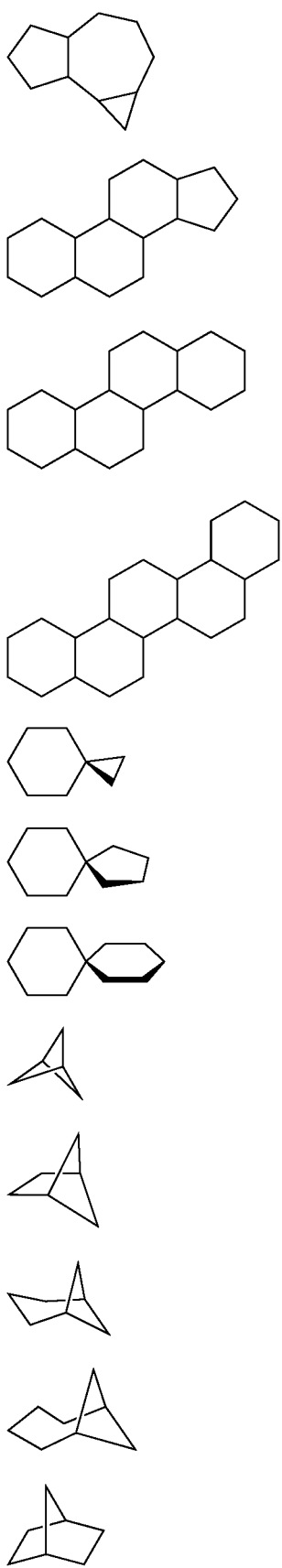
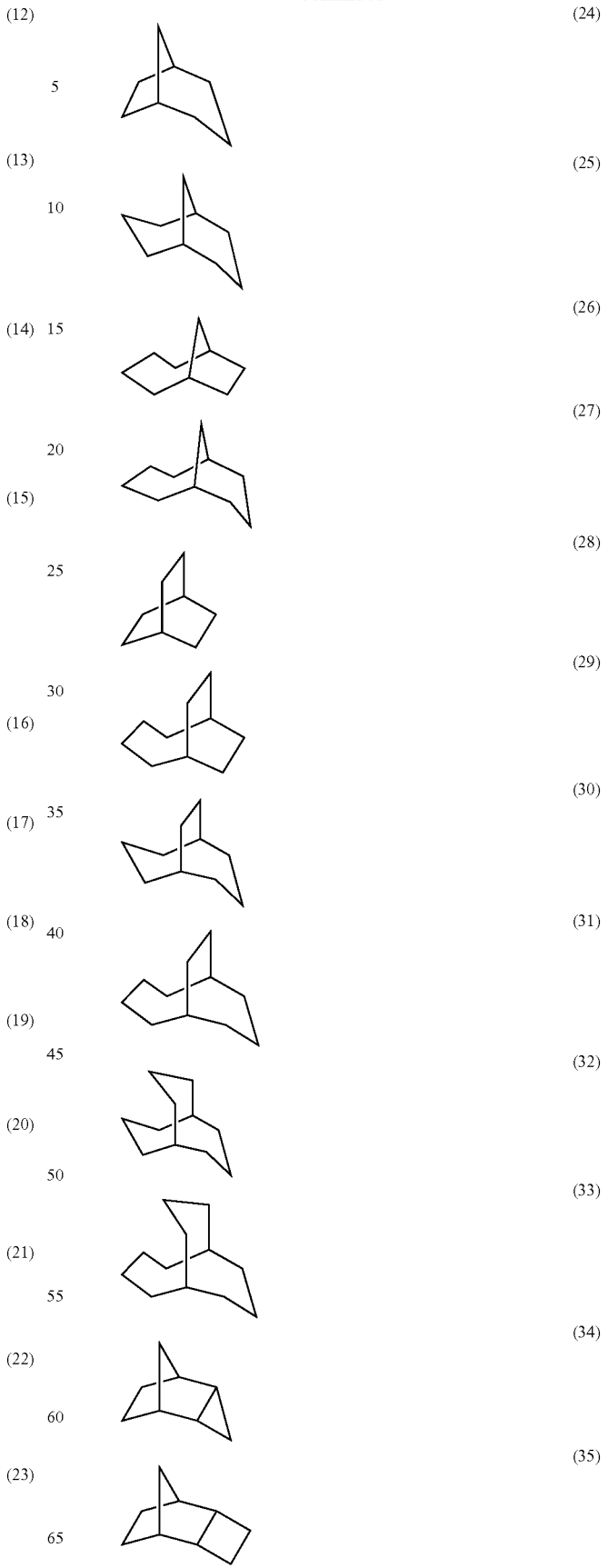

(36) 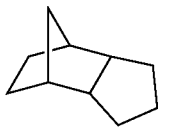

(37) 

(38) 

(39) 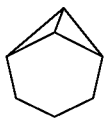

(40) 

(41) 

(42) 

(43) 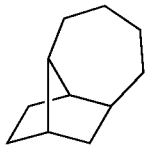

(44) 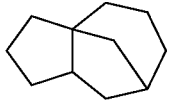

(45) 

(46) 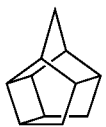

(47) 

(48) 

(49) 

(50) 

In the invention, the preferred of the above alicyclic moieties are an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group, and a cyclododecanyl group can be exemplified. More preferably, an adamantyl group, a decalin residue, a norbornyl group, a cedrol group, a cyclohexyl group, a cycloheptyl group, a cyclooctyl group, a cyclodecanyl group and a cyclododecanyl group are exemplified.

As the substituents of the alicyclic hydrocarbon groups, e.g., an alkyl group, a halogen atom, a hydroxyl group, an alkoxyl group, a carboxyl group, and an alkoxycarbonyl group are exemplified. The alkyl group is preferably a lower alkyl group, e.g., a methyl group, an ethyl group, a propyl group, an isopropyl group, and a butyl group, and more preferably substituents selected from the group consisting of a methyl group, an ethyl group, a propyl group, and an isopropyl group are exemplified. As the alkoxyl group, an alkoxyl group having from 1 to 4 carbon atoms, e.g., a methoxy group, an ethoxy group, a propoxy group, and a butoxy group can be exemplified.

The alkyl group, alkoxyl group, and alkoxycarbonyl group may further have a substituent, and as the examples of the substituents, an alkoxyl group having from 1 to 4 carbon atoms (e.g., a methoxy group, an ethoxy group, and a butoxy group), a hydroxyl group, an oxo group, an alkylcarbonyl group (preferably having from 2 to 5 carbon atoms), an alkylcarbonyloxy group (preferably having from 2 to 5 carbon atoms), an alkoxycarbonyl group (preferably having from 2 to 5 carbon atoms), and a halogen atom (a chlorine atom, a bromine atom and an iodine atom) can be exemplified.

For maintaining good developing properties in an alkali developing solution, resin (B) may be copolymerized with appropriate other monomers so as to be capable of introducing an alkali-soluble group, such as a phenolic hydroxyl group, a carboxyl group, a sulfonic acid group, or a hexafluoroisopropanol group (—$C(CF_3)_2OH$), or may be copolymerized with hydrophobic other polymerizable monomers such as alkyl acrylate or alkyl methacrylate for the purpose of the improvement of film properties.

The content of the repeating unit represented by formula (II) is preferably from 5 to 60 mol % in all the repeating units constituting the resin, more preferably from 10 to 50 mol %, and especially preferably from 10 to 40 mol %.

The content of the repeating unit represented by formula (III) is preferably from 40 to 90 mol % in all the repeating units constituting the resin, more preferably from 45 to 80 mol %, and especially preferably from 50 to 75 mol %.

The content of the repeating unit represented by formula (IV) is preferably from 5 to 50 mol % in all the repeating units constituting the resin, more preferably from 10 to 40 mol %, and especially preferably from 15 to 30 mol %.

The content of the repeating unit represented by formula (V) is preferably from 0 to 30 mol % in all the repeating units constituting the resin, more preferably from 0 to 20 mol %, and especially preferably from 0 to 10 mol %.

The content of the repeating unit having an alkali-soluble group such as a hydroxyl group, a carboxyl group or a sulfonic acid group is preferably from 1 to 99 mol % in all the repeating units constituting the resin, more preferably from 3 to 95 mol %, and especially preferably from 5 to 90 mol %.

The content of the repeating unit having an acid-decomposable group is preferably from 3 to 95 mol % in all the repeating units constituting the resin, more preferably from 5 to 90 mol %, and especially preferably from 10 to 85 mol %.

The resin can be synthesized according to conventionally known methods, such as methods of reacting an alkali-soluble resin with a precursor of an acid-decomposable group, or methods of copolymerization of a monomer having an acid-decomposable group with various monomers as disclosed in EP 254,853, JP-A-2-258500, JP-A-3-223860 and JP-A-4-251259.

The weight average molecular weight (Mw) of the resin is preferably in the range of from 1,000 to 5,000, more preferably in the range of from 1,500 to 4,000, and especially preferably in the range of from 2,000 to 3,000. From the point of the prevention of film reduction in an unexposed part, the weight average molecular weight is preferably 1,000 or more, and from dissolution rate in alkali of the resin itself and sensitivity, 5,000 or less is preferred.

Molecular weight polydispersity (Mw/Mn) is preferably from 1.0 to 3.0, more preferably from 1.0 to 2.0, and especially preferably from 1.0 to 1.6. Here, the weight average molecular weight is defined as the polystyrene equivalent by gel permeation chromatography.

Resin (B) may be used in combination of two or more kinds.

The addition amount of resin (B) is generally from 30 to 99 mass % based on all the solids content of the resist composition, preferably from 40 to 97 mass %, and especially preferably from 50 to 95 mass %.

The specific examples of component (B) for use in the invention are shown below, but the invention is not restricted thereto.

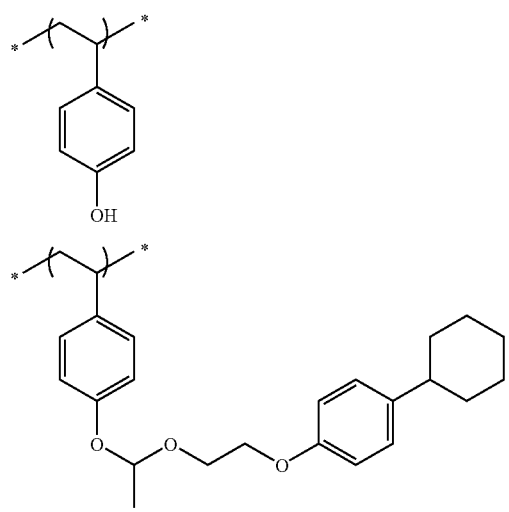

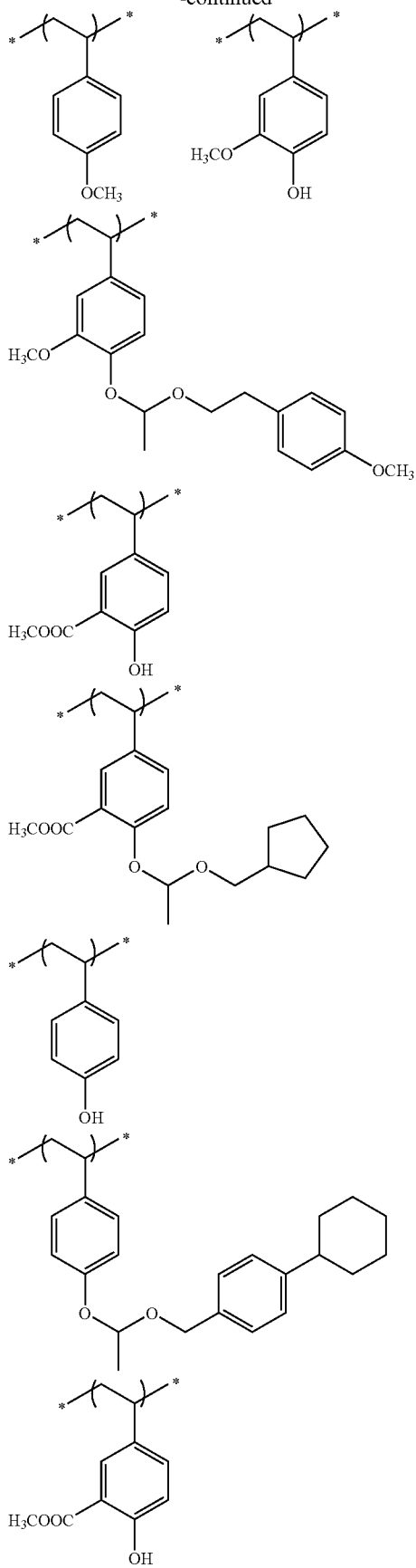

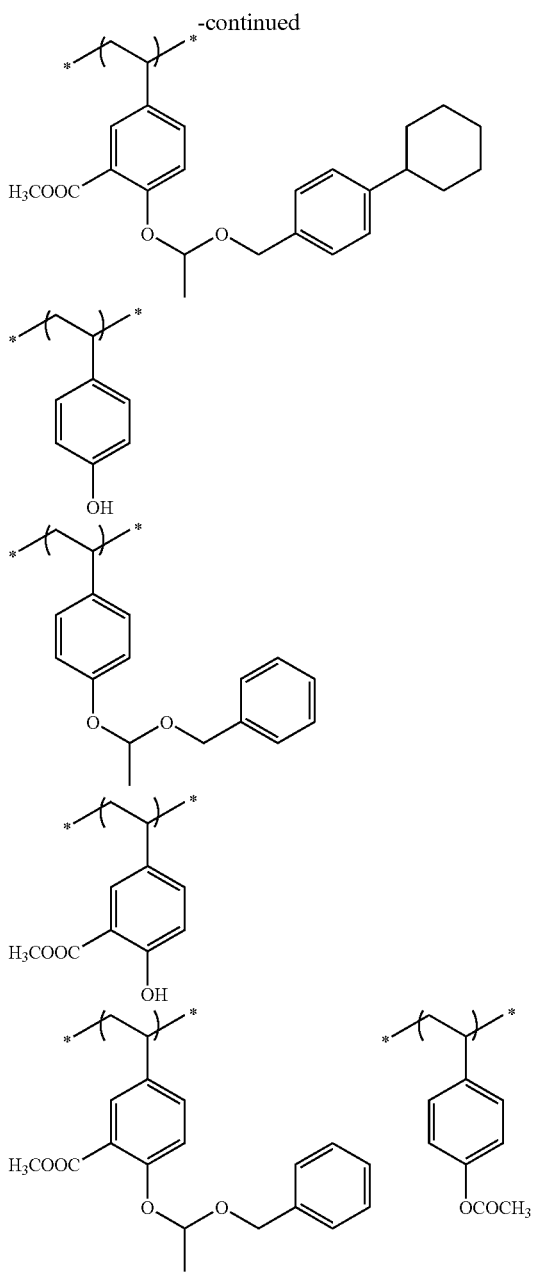

[4] Resin (C) Soluble in an Alkali Developing Solution:

The resin is hereinafter also referred to as "Component (C)" or "an alkali-soluble resin".

The alkali dissolution rate of the alkali-soluble resin is preferably 20 Å/sec or more when measured with 0.261N tetramethylammonium hydroxide (TMAH) at 23° C., and especially preferably 200 Å/sec or more.

As alkali-soluble resins for use in the invention, e.g., novolak resins, hydrogenated novolak resins, acetone-pyrogallol resins, o-polyhydroxystyrene, m-polyhydroxystyrene, p-polyhydroxystyrene, hydrogenated polyhydroxystyrene, halogen- or alkyl-substituted polyhydroxystyrene, hydroxystyrene-N-substituted maleimide copolymers, o/p- and m/p-hydroxystyrene copolymers, partially O-alkylated products of the hydroxyl group of polyhydroxystyrene (e.g., from 5 to 30 mol % O-methylated, O-(1-methoxy)ethylated, O-(1-ethoxy)ethylated, O-2-tetrahydropyranylated, and O-(t-butoxycarbonyl)methylated products), and partially O-acylated products (e.g., from 5 to 30 mol % o-acetylated, and O-(t-butoxy)carbonylated products), styrene-maleic acid anhydride copolymers, styrene-hydroxystyrene copolymers, α-methylstyrene-hydroxystyrene copolymers, carboxyl group-containing methacrylic resins and derivatives thereof, and polyvinyl alcohol derivatives can be exemplified, but the invention is not restricted to these resins.

Particularly preferred alkali-soluble resins are novolak resins, o-polyhydroxystyrene, m-polyhydroxystyrene, p-polyhydroxystyrene, copolymers of these resins, alkyl-substituted polyhydroxystyrene, partially O-alkylated or O-acylated products of polyhydroxystyrene, styrene-hydroxystyrene copolymers, and α-methylstyrene-hydroxystyrene copolymers.

The novolak resins can be obtained by addition condensation to aldehydes with the prescribed monomers as main components in the presence of an acid catalyst.

The weight average molecular weight of alkali-soluble resins is generally 2,000 or more, preferably from 5,000 to 200,000, and more preferably from 5,000 to 100,000.

Here, the weight average molecular weight is defined as the polystyrene equivalent by gel permeation chromatography.

Alkali-soluble resins (C) in the invention may be used in combination of two kinds or more.

The use amount of alkali-soluble resins is generally from 40 to 97 mass % based on all the solids content of the composition, and preferably from 60 to 90 mass %.

[5] Dissolution-Inhibiting Compound (D) Capable of Decomposing by the Action of an Acid to Increase Solubility in an Alkali Developing Solution Having a Molecular Weight of 3,000 or Less:

The compound is hereinafter also referred to as "component (D)" or "dissolution-inhibiting compound".

As dissolution inhibiting compound (D) capable of decomposing by the action of an acid to thereby increase the solubility in an alkali developing solution having a molecular weight of 3,000 or less, alicyclic or aliphatic compounds containing an acid-decomposable group, such as cholic acid derivatives containing an acid-decomposable group described in *Proceeding of SPIE*, 2724, 355 (1996) are preferred so as not to reduce the transmittance of lights of 220 nm or less. As the acid-decomposable groups and alicyclic structures, the same as those described in the alicyclic hydrocarbon-based acid-decomposable resin are exemplified.

Phenolic compounds having a structure that the phenolic hydroxyl group is substituted with an acid-decomposable group are preferably used. As the phenolic compounds, compounds containing from 1 to 9 phenolic skeletons are preferred, and those containing from 2 to 6 are more preferred.

The molecular weight of the dissolution-inhibiting compound is generally 3,000 or less, preferably from 300 to 3,000, and more preferably from 500 to 2,500.

The addition amount of the dissolution-inhibiting compound is preferably from 3 to 50 mass % based on all the solids content of the composition, and more preferably from 5 to 40 mass %.

The specific examples of the dissolution-inhibiting compounds are shown below, but the invention is not restricted thereto.

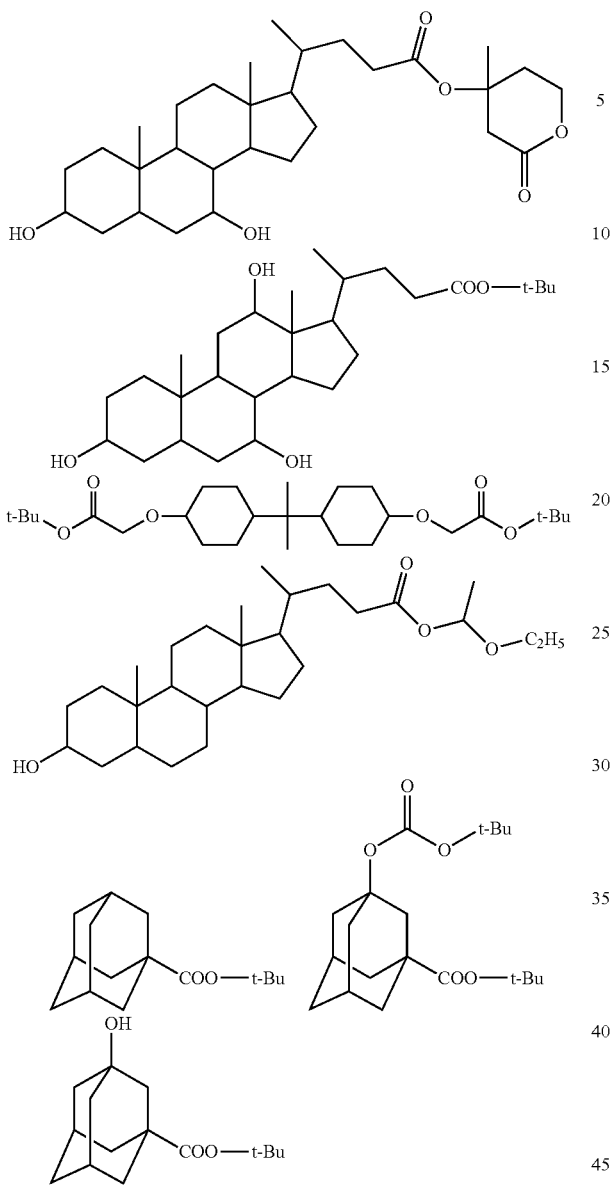

[6] Acid Crosslinking Agent (E) Capable of Crosslinking with the Alkali-Soluble Resin by the action of an acid:

The acid crosslinking agent is hereinafter also referred to as "component (E)" or "crosslinking agent".

A crosslinking agent is used in the negative resist composition of the invention.

Every compound capable of crosslinking the resins soluble in an alkali developing solution by the action of an acid can be used as crosslinking agents, but the following (1) to (3) are preferably used.

(1) Hydroxymethyl material, alkoxymethyl material, and acyloxymethyl material of phenol derivatives (2) Compounds having an N-hydroxymethyl group, an N-alkoxymethyl group, or an N-acyloxymethyl group (3) Compounds having an epoxy group As the alkoxymethyl groups, those having 6 or less carbon atoms, and as the acyloxymethyl groups, those having 6 or less carbon atoms are preferred.

Of these crosslinking agents, particularly preferred compounds are shown below.

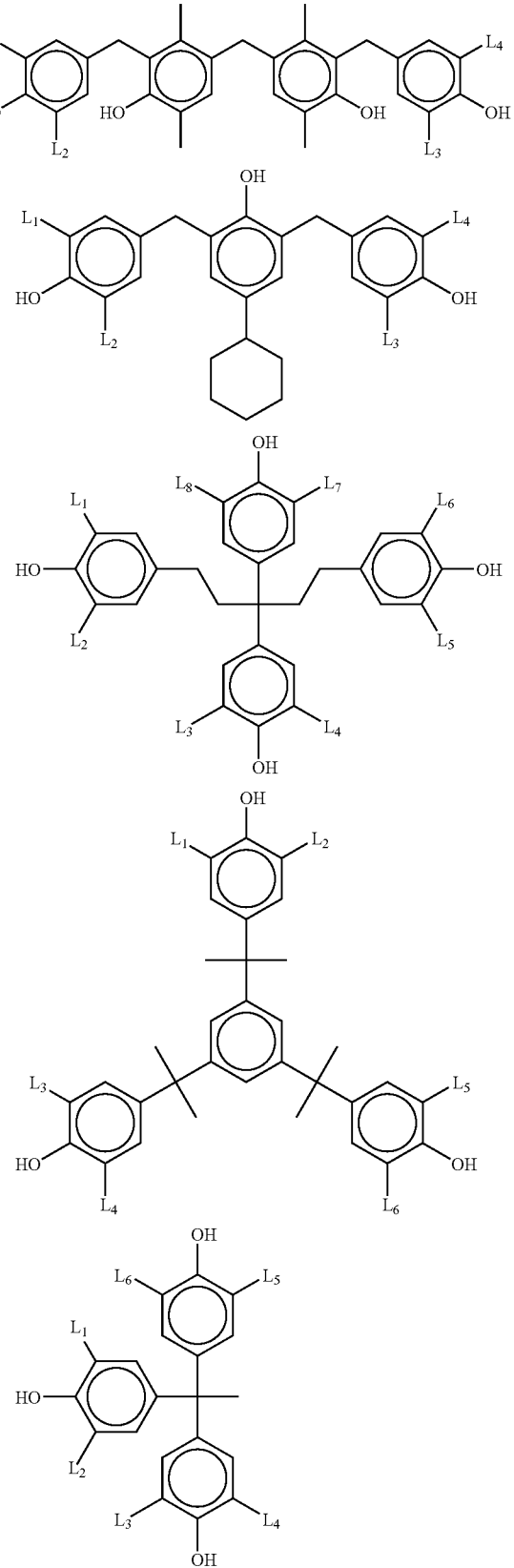

-continued

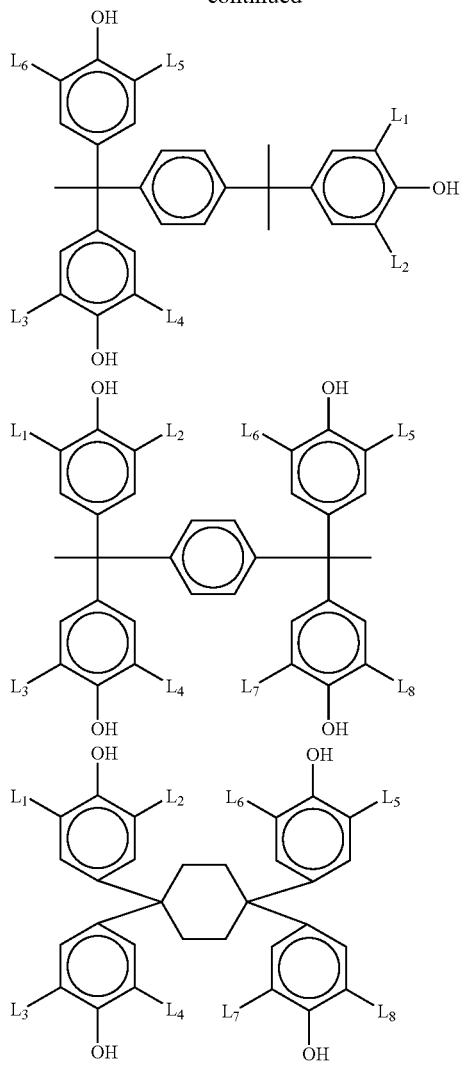

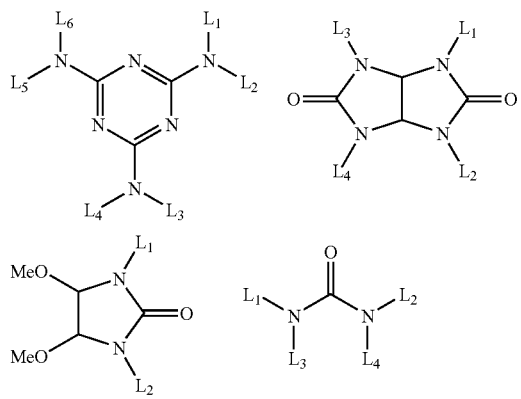

In the above formulae, $L_1$ to $L_8$, which may be the same or different, each represents a hydrogen atom, a hydroxymethyl group, a methoxymethyl group, an ethoxymethyl group, or an alkyl group having from 1 to 6 carbon atoms. The crosslinking agents are used generally in proportion of from 3 to 70 mass % in the solids content of the resist composition, and preferably from 5 to 50 mass %.

[7] Basic Compound (F):

For decreasing the fluctuation of performances due to aging from exposure to heating, it is preferred for the resist composition of the invention to contain a basic compound.

As preferred structures, the structures represented by any of the following formulae (A) to (E) can be exemplified.

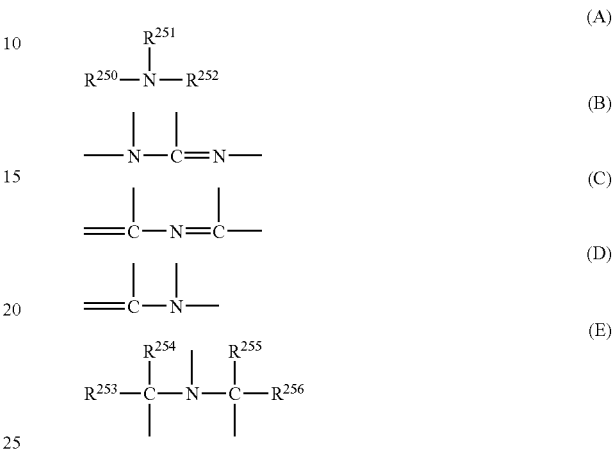

In formula (A), each of $R^{250}$, $R^{251}$ and $R^{252}$ independently represents a hydrogen atom, an alkyl group having from 1 to 20 carbon atoms, a cycloalkyl group having from 3 to 20 carbon atoms, or an aryl group having from 6 to 20 carbon atoms, and $R^{250}$ and $R^{251}$ may be bonded to each other to form a ring. These groups may have a substituent, and as the alkyl group and cycloalkyl group having a substituent, an aminoalkyl group having from 1 to 20 carbon atoms or an aminocycloalkyl group having from 3 to 20 carbon atoms, a hydroxyalkyl group having from 1 to 20 carbon atoms or a hydroxycycloalkyl group having from 3 to 20 carbon atoms are preferred.

These groups may contain an oxygen atom, a sulfur atom or a nitrogen atom in the alkyl chain.

In formula (E), each of $R^{253}$, $R^{254}$, $R^{255}$ and $R^{256}$ independently represents an alkyl group having from 1 to 6 carbon atoms, or a cycloalkyl group having from 3 to 6 carbon atoms.

As preferred basic compounds, guanidine, iminopyrrolidine, pyrazole, pyrazoline, piperazine, aminomorpholine, aminoalkylmorpholine, and piperidine can be exemplified, and these compounds may have a substituent. As further preferred compounds, compounds having an imidazole structure, a diazabicyclo structure, an onium hydroxide structure, an onium carboxylate structure, a trialkylamine structure, an aniline structure, a pyridine structure, alkylamine derivatives having at least one of a hydroxyl group and an ether bond, and aniline derivatives having at least one of a hydroxyl group and an ether bond can be exemplified.

As the compounds having an imidazole structure, imidazole, 2,4,5-triphenyl-imidazole, and benzimidazole can be exemplified. As the compounds having a diazabicyclo structure, 1,4-diazabicyclo[2.2.2]octane, 1,5-diazabicyclo[4.3.0]nona-5-ene, and 1,8-diazabicyclo[5.4.0]undeca-7-ene can be exemplified. As the compounds having an onium hydroxide structure, triarylsulfonium hydroxide, phenacylsulfonium hydroxide, sulfonium hydroxide having a 2-oxoalkyl group, specifically triphenyl-sulfonium hydroxide, tris(t-butyl-phenyl)sulfonium hydroxide, bis(t-butylphenyl)-iodonium hydroxide, phenacylthiophenium hydroxide, and 2-oxopropylthiophenium hydroxide can be exemplified. The compounds having an onium carboxylate structure are compounds having an onium hydroxide structure in which the anionic part is carboxylated, e.g., acetate, adamantane-1-carboxylate, and perfluoroalkyl carboxylate are exemplified. As the compounds having a trialkylamine structure, tri(n-butyl) amine and tri(n-octyl)amine can be exemplified. As the aniline compounds, 2,6-diisopropylaniline and N,N-dimethylaniline can be exemplified. As the alkylamine derivatives having at least one of a hydroxyl group and an ether bond, ethanolamine, diethanolamine, triethanolamine, and tris(methoxyethoxyethyl)amine can be exemplified. As the aniline derivatives having at least one of a hydroxyl group and an ether bond, N,N-bis(hydroxyethyl)aniline can be exemplified.

Further, at least one kind of nitrogen-containing compound selected from an amine compound having a phenoxy group, an ammonium salt compound having a phenoxy group, an amine compound having a sulfonate group, and an ammonium salt compound having a sulfonate group can be exemplified.

As the amine compound, primary, secondary and tertiary amine compounds can be used, and an amine compound such that at least one alkyl group is bonded to the nitrogen atom is preferred. The amine compound is more preferably a tertiary amine compound. As the amine compound, a cycloalkyl group (preferably having from 3 to 20 carbon atoms) or an aryl group (preferably having from 6 to 12 carbon atoms) may be bonded to the nitrogen atom besides an alkyl group so long as at least one alkyl group (preferably having from 1 to 20 carbon atoms) is bonded to the nitrogen atom.

Further, it is preferred that the amine compound has an oxygen atom in the alkyl chain and an oxyalkylene group is formed. The number of the oxyalkylene group is one or more in the molecule, preferably from 3 to 9, and more preferably from 4 to 6. Of the oxyalkylene groups, an oxyethylene group (—CH$_2$CH$_2$O—) or an oxypropylene group (—CH(CH$_3$)CH$_2$O— or —CH$_2$CH$_2$CH$_2$O—) is preferred, and an oxyethylene group is more preferred.

As the ammonium salt compound, primary, secondary, tertiary and quaternary ammonium salt compounds can be used, and an ammonium salt compound such that at least one alkyl group is bonded to the nitrogen atom is preferred. As the ammonium salt compound, a cycloalkyl group (preferably having from 3 to 20 carbon atoms) or an aryl group (preferably having from 6 to 12 carbon atoms) may be bonded to the nitrogen atom besides an alkyl group so long as at least one alkyl group (preferably having from 1 to 20 carbon atoms) is bonded to the nitrogen atom.

Further, it is preferred that the ammonium salt compound has an oxygen atom in the alkyl chain and an oxyalkylene group is formed. The number of the oxyalkylene group is one or more in the molecule, preferably from 3 to 9, and more preferably from 4 to 6. Of the oxyalkylene groups, an oxyethylene group (—CH$_2$CH$_2$O—) or an oxypropylene group (—CH(CH$_3$)CH$_2$O— or —CH$_2$CH$_2$CH$_2$O—) is preferred, and an oxyethylene group is more preferred. As the anion of the ammonium salt compound, a halogen atom, sulfonate, borate, phosphate, etc., are exemplified, and a halogen atom and sulfonate are especially preferred. As the halogen atom, chloride, bromide and iodide are especially preferred, and organic sulfonate having from 1 to 20 carbon atoms is especially preferred as the sulfonate. As the organic sulfonate, alkylsulfonate having from 1 to 20 carbon atoms and arylsulfonate are exemplified. The alkyl group of the alkylsulfonate may have a substituent, e.g., fluorine, chlorine, bromine, an alkoxyl group, an acyl group and an aryl group are exemplified. As the alkylsulfonate, specifically methanesulfonate, ethanesulfonate, butanesulfonate, hexanesulfonate, octanesulfonate, benzylsulfonate, trifluoromethanesulfonate, pentafluoroethanesulfonate, and nonafluorobutanesulfonate are exemplified. As the aryl group of the arylsulfonate, a benzene ring, a naphthalene ring, and an anthracene ring are exemplified. The benzene ring, naphthalene ring and anthracene ring may have a substituent, and as the substituents, a straight chain or branched alkyl group having from 1 to 6 carbon atoms and a cycloalkyl group having from 3 to 6 carbon atoms are preferred. As the straight chain or branched alkyl group and the cycloalkyl group, specifically methyl, ethyl, n-propyl, isopropyl, n-butyl, i-butyl, t-butyl, n-hexyl and cyclohexyl are exemplified. As other substituents, an alkoxyl group having from 1 to 6 carbon atoms, a halogen atom, a cyano group, a nitro group, an acyl group and an acyloxy group are exemplified.

The amine compound having a phenoxy group and the ammonium salt compound having a phenoxy group are those each having a phenoxy group at terminals on the opposite side to the nitrogen atom of the alkyl group of the amine compound and the ammonium salt compound. The phenoxy group may have a substituent. As the substituent of the phenoxy group, e.g., an alkyl group, an alkoxyl group, a halogen atom, a cyano group, a nitro group, a carboxyl group, a carboxylate group, a sulfonate group, an aryl group, an aralkyl group, an acyloxy group and an aryloxy group are exemplified. The substituent may be substituted anywhere from 2- to 6-positions. The number of the substituent may be any in the range of from 1 to 5.

It is preferred to have at least one oxyalkylene group between the phenoxy group and the nitrogen atom. The number of the oxyalkylene group is one or more in the molecule, preferably from 3 to 9, and more preferably from 4 to 6. Of the oxyalkylene groups, an oxyethylene group (—CH$_2$CH$_2$O—) or an oxypropylene group (—CH(CH$_3$)CH$_2$O— or —CH$_2$CH$_2$CH$_2$O—) is preferred, and an oxyethylene group is more preferred.

In the amine compound having a sulfonate group and the ammonium salt compound having a sulfonate group, the sulfonate group may be any of alkylsulfonate, cycloalkylsulfonate and arylsulfonate. It is preferred that in the case of alkylsulfonate, the alkyl group has from 1 to 20 carbon atoms, in the case of cycloalkylsulfonate, the cycloalkyl group has from 3 to 20 carbon atoms, and in the case of arylsulfonate, the aryl group has from 6 to 12 carbon atoms. The alkylsulfonate, cycloalkylsulfonate and arylsulfonate may have a substituent, and, e.g., a halogen atom, a cyano group, a nitro group, a carboxyl group, a carboxylate group and a sulfonate group are preferred as the substituents.

It is preferred to have at least one oxyalkylene group between the sulfonate group and the nitrogen atom. The number of the oxyalkylene group is one or more in the molecule, preferably from 3 to 9, and more preferably from 4 to 6. Of the oxyalkylene groups, an oxyethylene group (—CH$_2$CH$_2$O—) or an oxypropylene group (—CH(CH$_3$)CH$_2$O— or —CH$_2$CH$_2$CH$_2$O—) is preferred, and an oxyethylene group is more preferred.

The amine compound having a phenoxy group can be obtained by reacting primary or secondary amine having a phenoxy group and haloalkyl ether by heating, adding an aqueous solution of strong base such as sodium hydroxide, potassium hydroxide or tetraalkylammonium, and extracting with an organic solvent such as ethyl acetate or chloroform. Alternatively, the amine compound having a phenoxy group can be obtained by reacting primary or secondary amine and haloalkyl ether having a phenoxy group at the terminal by heating, adding an aqueous solution of strong base such as sodium hydroxide, potassium hydroxide or tetraalkylammonium, and extracting with an organic solvent such as ethyl acetate or chloroform.

These basic compounds are used by one kind alone, or two or more in combination. However, when the use amount of component (B) is 0.05 mass % or more, the basic compound may be used or may not be used. When the basic compound is used, the use amount is generally from 0.001 to 10 mass % based on the solids content of the resist composition, and preferably from 0.01 to 5 mass %. For obtaining sufficient addition effect, the addition amount is preferably 0.001 mass % or more, and in the point of sensitivity and developing properties of an unexposed part, the amount is preferably 10 mass % or less.

[8] Fluorine and/or Silicon Surfactant (G):

It is preferred for the resist composition of the invention to further contain either one, or two or more of fluorine and/or silicon surfactants (a fluorine surfactant and a silicon surfactant, a surfactant containing both a fluorine atom and a silicon atom).

By containing fluorine and/or silicon surfactants, it becomes possible for the resist composition in the invention to provide a resist pattern excellent in sensitivity and resolution, and low in defects in adhesion and development.

These fluorine and/or silicon surfactants are disclosed, e.g., in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, U.S. Pat. Nos. 5,405,720, 5,360,692, 5,529,881, 5,296,330, 5,436,098, 5,576,143, 5,294,511 and 5,824,451. Commercially available surfactants shown below can also be used as they are.

As commercially available fluorine or silicon surfactants usable in the invention, e.g., Eftop EF301 and EF303 (manufactured by Shin-Akita Kasei Co., Ltd.), Fluorad FC 430 and 431 (manufactured by Sumitomo 3M Limited), Megafac F171, F173, F176, F189, and R08 (manufactured by Dainippon Ink and Chemicals Inc.), Sarfron S-382, SC 101, 102, 103, 104, 105 and 106 (manufactured by ASAHI GLASS CO., LTD.), Troy Sol S-366 (manufactured by Troy Chemical Co., Ltd.) are exemplified. In addition, polysiloxane polymer KP-341 (manufactured by Shin-Etsu Chemical Co., Ltd.) can also be used as a silicon surfactant.

In addition to these known surfactants as exemplified above, surfactants using polymers having fluoro-aliphatic groups derived from fluoro-aliphatic compounds manufactured by a telomerization method (also called a telomer method) or an oligomerization method (also called an oligomer method) can be used. The fluoro-aliphatic compounds can be synthesized by the method disclosed in JP-A-2002-90991.

As the polymers having fluoro-aliphatic groups, copolymers of monomers having fluoro-aliphatic groups and (poly(oxyalkylene))acrylate and/or (poly(oxyalkylene))methacrylate are preferred, and they may be distributed at random or block copolymerized. As the poly(oxyalkylene) groups, a poly(oxyethylene) group, a poly(oxypropylene) group, and a poly(oxybutylene) group are exemplified. Further, the polymers may be units having alkylenes different in chain length in the same chain length, such as a block combination of poly(oxyethylene and oxypropylene and oxyethylene), and a block combination of poly(oxyethylene and oxypropylene). In addition, copolymers of monomers having fluoro-aliphatic groups and poly(oxyalkylene) acrylate (or methacrylate) may be not only bipolymers but also terpolymers or higher polymers obtained by copolymerization of monomers having different two or more kinds of fluoro-aliphatic groups and different two or more kinds of poly(oxyalkylene) acrylates (or methacrylates) at the same time.

For example, as commercially available surfactants, Megafac F178, F470, F473, F475, F476 and F472 (manufactured by Dainippon Ink and Chemicals Inc.) can be exemplified. Further, copolymers of acrylate (or methacrylate) having a $C_6F_{13}$ group and (poly(oxyalkylene))acrylate (or methacrylate), copolymers of acrylate (or methacrylate) having a $C_6F_{13}$ group, (poly(oxyethylene))acrylate (or methacrylate), and (poly(oxypropylene))acrylate (or methacrylate), copolymers of acrylate (or methacrylate) having a $C_8F_{17}$ group and (poly(oxyalkylene))acrylate (or methacrylate), and copolymers of acrylate (or methacrylate) having a $C_8F_{17}$ group, (poly(oxyethylene)) acrylate (or methacrylate), and poly(oxypropylene)acrylate (or methacrylate) are exemplified.

The addition amount of fluorine and/or silicon surfactant is preferably from 0.0001 to 2 mass % based on all the amount of the resist composition (excluding solvents), and more preferably from 0.001 to 1 mass %.

[9] Organic Solvent (H):

The above components of the resist composition of the invention are dissolved in a prescribed organic solvent.

As the organic solvents usable in the invention, ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, and tetrahydrofuran are exemplified.

(Ia) Ketone Solvents:

Solvents containing at least a ketone structure are preferably used in the invention.

As the solvents containing a ketone structure, chain-like ketone solvents and cyclic ketone solvents are exemplified, and compounds having from 5 to 8 carbon atoms are preferred for capable of obtaining good coating property.

As the chain-like ketone solvents, e.g., 2-heptanone, methyl ethyl ketone, methyl isobutyl ketone, etc., are exemplified, and 2-heptanone is preferred.

As the cyclic ketone solvents, e.g., cyclopentanone, 3-methyl-2-cyclo-pentanone, cyclohexanone, 2-methylcyclohexanone, 2,6-dimethylcyclohexanone, cycloheptanone, cyclooctanone, and isophorone are exemplified, and cyclohexanone and cycloheptanone are preferred.

It is preferred that the solvents having a ketone structure are used alone, or as mixed solvents with other solvents. As the solvents to be mixed (combined use solvents), propylene glycol monoalkyl ether carboxylate, alkyl lactate, propylene glycol monoalkyl ether, alkyl alkoxypropionate, and lactone compounds can be exemplified.

As the propylene glycol monoalkyl ether carboxylate, e.g., propylene glycol monomethyl ether acetate, propylene glycol monomethyl ether propionate, and propylene glycol monoethyl ether acetate can be exemplified.

As the alkyl lactate, e.g., methyl lactate and ethyl lactate can be exemplified.

As the propylene glycol monoalkyl ether, e.g., propylene glycol monomethyl ether and propylene glycol monoethyl ether can be exemplified.

As the alkyl alkoxypropionate, e.g., methyl methoxypropionate, ethyl methoxypropionate, methyl ethoxypropionate and ethyl ethoxypropionate can be exemplified.

As the lactone compounds, e.g., γ-butyrolactone can be exemplified.

As preferred combined use solvent, propylene glycol monoalkyl ether carboxylate, alkyl lactate and propylene glycol monoalkyl ether can be exemplified, and as more preferred combined use solvent, propylene glycol monomethyl ether acetate can be exemplified.

By the use of mixed solvents of ketone solvents and combined use solvents, substrate adhesion, developability and DOF are improved.

The ratio of the ketone solvent and the combined use solvent (mass ratio) is preferably from 10/90 to 95/5, more preferably from 20/80 to 80/20, and still more preferably from 30/70 to 70/30.

In view of heightening uniform film thickness and resistance to development defect, high boiling point solvents having a boiling point of 200° C. or higher, such as ethylene carbonate and propylene carbonate may be mixed.

The addition amount of these high boiling point solvents is generally from 0.1 to 15 mass % in all the solvents, preferably from 0.5 to 10 mass %, and more preferably from 1 to 5 mass %.

In the invention, a resist composition having solids content concentration of generally from 0.05 to 10 mass %, preferably from 0.1 to 5 mass %, and more preferably from 0.2 to 4 mass % is prepared with a single solvent, preferably two or more solvents.

[10] Other Additives (I):

If necessary, dyes, plasticizers, surfactants other than the surfactants of component (G), photosensitizers, and compounds for expediting the dissolution of composition in a developing solution may be further added to the resist composition in the present invention.

Compounds for expediting dissolution in a developing solution that can be used in the invention are low molecular weight compounds having a molecular weight of 1,000 or less and having two or more phenolic OH groups or one or more carboxyl groups. When carboxyl groups are contained, alicyclic or aliphatic compounds are preferred.

The preferred addition amount of these dissolution accelerating compounds is preferably from 2 to 50 mass % based on the resin of component (B) or the resin of component (C), and more preferably from 5 to 30 mass %. The amount is preferably 50 mass % or less in the point of restraint of development residue and prevention of pattern deformation in development.

These phenolic compounds having a molecular weight of 1,000 or less can be easily synthesized with referring to the methods disclosed, e.g., in JP-A-4-122938, JP-A-2-28531, U.S. Pat. No. 4,916,210, and EP 219,294.

As the specific examples of the alicyclic or aliphatic compounds having a carboxyl group, carboxylic acid derivatives having a steroid structure, e.g., cholic acid, deoxycholic acid, and lithocholic acid, adamantanecarboxylic acid derivatives, adamantanedicarboxylic acid, cyclohexanecarboxylic acid, and cyclohexane-dicarboxylic acid are exemplified, but the invention is not restricted to these compounds.

In the invention, surfactants other than fluorine and/or silicon surfactants (G) can also be used. Specifically, nonionic surfactants, such as polyoxyethylene alkyl ethers, polyoxyethylene alkylallyl ethers, polyoxyethylene-polyoxypropylene block copolymers, sorbitan aliphatic esters, and polyoxyethylene sorbitan aliphatic esters can be exemplified.

These surfactants may be used alone or may be used in combination of some kinds.

[11] Pattern-Forming Method (J):

The resist composition in the invention is used by dissolving the above components in a prescribed organic solvent, preferably a mixed solvent as described above, and coating the solution on a prescribed support as follows.

For example, the resist composition is coated on a substrate such as the one used in the manufacture of precision integrated circuit element (e.g., silicon/silicon dioxide coating) by an appropriate coating method with a spinner or a coater, and dried, to thereby form a resist film. Incidentally, it is also possible to coat a known antireflection film.

The resist film is irradiated with actinic ray or radiation through a prescribed mask, preferably subjected to baking (heating), and then development. Thus, a good pattern can be obtained.

As actinic rays or radiation, infrared rays, visible rays, ultraviolet rays, far ultraviolet rays, X-rays and electron beams can be exemplified, and preferably far ultraviolet rays of wavelengths of 250 nm or less, and more preferably 220 nm or less. Specifically, a KrF excimer laser (248 nm), X-rays and electron beams are exemplified, and EUV (13 nm), electron beams and X-rays are preferred.

In a development process, an alkali developing solution is used as follows. As the alkali developing solution of a resist composition, alkaline aqueous solutions of inorganic alkalis, e.g., sodium hydroxide, potassium hydroxide, sodium carbonate, sodium silicate, sodium metasilicate, aqueous ammonia, etc., primary amines, e.g., ethylamine and n-propylamine, secondary amines, e.g., diethylamine and di-n-butylamine, tertiary amines, e.g., triethylamine and methyldiethylamine, alcohol amines, e.g., dimethylethanolamine and triethanolamine, quaternary ammonium salts, e.g., tetramethylammonium hydroxide and tetraethylammonium hydroxide, and cyclic amines, e.g., pyrrole and piperidine can be used.

An appropriate amount of alcohols and surfactants may be added to the above alkali developing solutions.

The alkali concentration of an alkali developing solution is generally from 0.1 to 20 mass %.

The pH of an alkali developing solution is generally from 10.0 to 15.0.

Example

The invention will be described in further detail with reference to examples, but the invention is by no means restricted thereto.

Compound (A1):

(1) Synthesis of Dibenzothiophene-S-oxide

Dibenzothiophene (20.0 g) is suspended in 80.0 ml of trifluoroacetic acid at room temperature. Into the suspension is slowly dropped 12.4 ml of 30% aqueous hydrogen peroxide while cooling with ice so as to maintain the reaction temperature around 60° C. After completion of dropping, the reaction solution is stirred at room temperature for 30 minutes. After the reaction, the reaction solution is added to 1,000 ml of water to precipitate crystals. The crystals are recovered by filtration and washed with water. The obtained crystals are recrystallized with acetonitrile to obtain 19.2 g of dibenzothiophene-S-oxide.

$^1$H-NMR (400 MHz, CDCl$_3$) δ 7.51 (t, 2H), 7.59 (t, 2H), 7.81 (d, 2H), 8.00 (d, 2H)

(2) Synthesis of 5-[4-(2-hydroxyethyl)phenyl]dibenzothiophenium 2,4,6-triisopropyl-benzenesulfonate (A1)

While cooling with ice, 10.0 g of dibenzothiophene-S-oxide synthesized in the above step (1) is added to 30 g of diphosphorus pentoxide/methanesulfonic acid (9/1), and further 10 ml of 2-phenylethyl acetate is added thereto. The reaction solution is stirred at room temperature for 6 hours, and then poured into ice water. The obtained aqueous solution is filtered, and 23 g of potassium iodide is added. Crystals precipitated are recovered by filtration to obtain 11.1 g of 5-[4-(2-acetoxyethyl)-phenyl]dibenzothiophenium iodide. The obtained 11.1 g of 5-[4-(2-acetoxyethyl)-phenyl]dibenzothiophenium iodide is dissolved in 200 ml of methanol, and 10.7 g of a 20% aqueous solution of tetramethylammonium hydroxide is added to the solution. After stirring the solution at room temperature for 2 hours, 9.6 g of triisopropyl-benzenesulfonic acid is added and the reaction solution is further stirred at room temperature for 30 minutes. Silver acetate (3.9 g) is added to the reaction solution and stirred at room temperature for 1 hour. After filtering the reaction solution, the mother liquor is distilled under reduced pressure. The crystals obtained are dissolved in chloroform, and washed with water three times. After distilling off chloroform under reduced pressure, the reaction product is recrystallized with ethyl acetate/acetonitrile (5/1), whereby 7.0 g of 5-[4-(2-hydroxyethyl)phenyl]-dibenzothiophenium 2,4,6-triisopropylbenzenesulfonate is obtained.

$^1$H-NMR (400 MHz, CDCl$_3$) δ 1.20 (d, 18H), 2.78 (m, 3H), 3.71 (t, 2H), 4.68 (m, 2H), 7.02 (s, 2H), 7.29 (d, 2H), 7.51 (t, 2H), 7.64 (d, 2H), 7.76 (t, 2H), 8.14 (d, 2H), 8.22 (d, 2H)

(3) Synthesis of 5-[4-(2-hydroxyethyl)phenyl]dibenzothiophenium nonafluorobutanesulfonate (A2)

While cooling with ice, 10.0 g of dibenzothiophene-S-oxide synthesized in the above step (1) is stirred in 10 ml of 2-phenylethyl acetate, and 5.7 ml of trifluoroacetic acid anhydride is added thereto. The reaction solution is stirred at room temperature for 1 hour. After the reaction, 20 ml of diisopropyl ether is added thereto to precipitate crystals, and the crystals are recovered by filtration. The crystals obtained (9.3 g) are dissolved in 200 ml of methanol, and 10.7 g of a 20% aqueous solution of tetramethylammonium hydroxide is added to the solution. The solution is stirred at room temperature for 2 hours. After the reaction, the methanol is distilled off under reduced pressure, and the crystals obtained are dissolved in chloroform, and washed with water three times. After distilling off a chloroform layer under reduced pressure, the reaction product is recrystallized with ethyl acetate/acetonitrile (5/1), whereby 8.5 g of 5-[4-(2-hydroxyethyl)phenyl]dibenzothiophenium nonafluorobutanesulfonate is obtained.

$^1$H-NMR (400 MHz, CDCl$_3$) δ 2.80 (t, 2H), 3.73 (t, 2H), 7.29 (d, 2H), 7.53 (t, 2H), 7.60 (d, 2H), 7.80 (t, 2H), 8.16 (d, 2H), 8.25 (d, 2H)

Synthesis of Resin (B):

Resin A-1 shown below is synthesized as follows.

1-1. Synthesis of Polymer 1a:

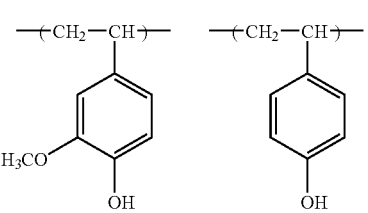

In a reaction vessel, 96.1 g (0.5 mol) of 3-methoxy-4-acetoxystyrene (manufactured by Honshu Chemical Industry Co., Ltd.) and 81.1 g (0.5 mol) of 4-acetoxystyrene (manufactured by Honshu Chemical Industry Co., Ltd.) are dissolved in 400 ml of tetrahydrofuran, and nitrogen gas is streamed to the reaction solution while stirring. To the solution is added 23.0 g (0.1 mol) of polymerization initiator V-601 (manufactured by Wako Pure Chemical Industries), and the reaction solution is heated at 65° C. After stirring for 10 hours, the reaction solution is allowed to cool to room temperature and then dropped into 5 liters of hexane to precipitate a polymer. A filtered solid is dissolved in 600 ml of acetone, dropped again into 5 liters of hexane and a filtered solid is dried under reduced pressure to obtain 150.6 g of a (3-methoxy-4-acetoxystyrene)-(4-acetoxystyrene) copolymer.

In a reaction vessel, 130 g of the obtained polymer, 500 ml of methanol, 500 ml of 1-methoxy-2-propanol, 2.0 ml of concentrated hydrochloric acid, and 30 ml of distilled water are stirred for 5 hours at 80° C. The reaction solution is allowed to cool to room temperature and then dropped into 3 liters of distilled water. A filtered solid is dissolved in 120 ml of acetone, dropped again into 3 liters of distilled water, and a filtered solid is dried under reduced pressure to obtain 79.3 g of polymer 1a. The weight average molecular weight of the polymer by GPC is 6,000, the molecular weight polydispersity is 1.55, and compositional ratio found by $^1$H-NMR is 51/49 from the left side of the formula.

1-2. Synthesis of Polymer A-1:

In a reaction vessel, 30 g of the obtained polymer 1a is dissolved in 100 g of PGMEA, the pressure of the solution is reduced up to 20 mmHg at 60° C., and about 20 g of the solvent is distilled off with the water remaining in the reaction system. The reaction solution is cooled to 20° C., 15.25 g of 2-benzenecarboxylic acid ethyl vinyl ether and 1.0 g of p-toluefnesulfonic acid are added to the solution, and the reaction solution is stirred at room temperature for 1 hour. After that, the reaction solution is neutralized with 1.16 g of triethylamine, and then 40 g of ethyl acetate and 40 g of water are added thereto and the reaction product is washed three times. Subsequently, the solvent amount is adjusted to obtain 30 mass % of a polymer solution. The weight average molecular weight of polymer A-1 by GPC is 6,600, the molecular weight polydispersity is 1.51, and compositional ratio found by $^1$H and $^{13}$C-NMR analysis is 45/5/19/31 from the left side of the formula.

Other resins are also synthesized in a similar method.

The structure, molecular weight and polydispersity of each resin (B) used in Examples are shown below. The figure on the right side of each repeating unit is a molar ratio.

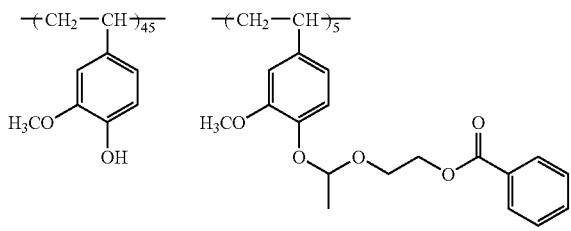

A-1

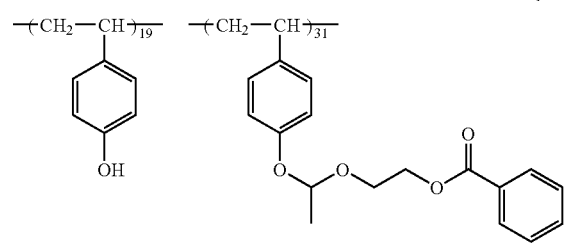

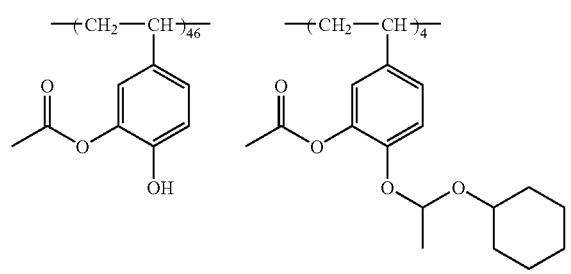

A-2

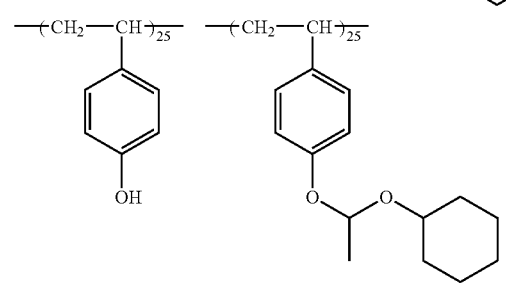

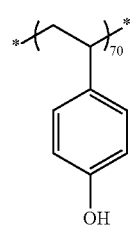

E-1

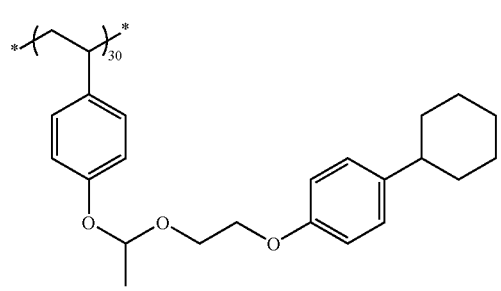

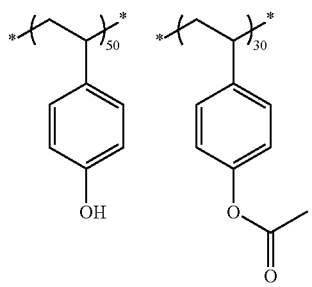

E-2

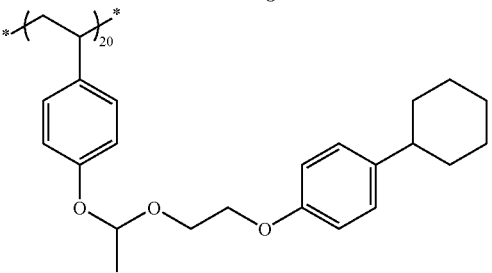

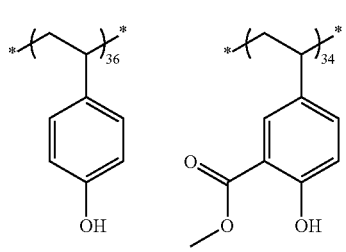

E-3

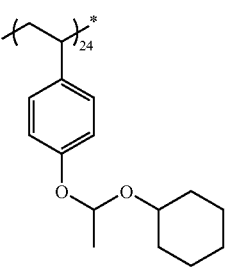

A-1: Weight average molecular weight: 6,600, polydispersity: 1.51

A-2: Weight average molecular weight: 9,900, polydispersity: 1.65

E-1: Weight average molecular weight: 4,000, polydispersity: 1.55

E-2: Weight average molecular weight: 3,100, polydispersity: 1.58

E-3: Weight average molecular weight: 2,500, polydispersity: 1.52

Examples 1 to 9 and Comparative Examples 1 to 3

The symbols of the components are as follows.

Acid Generators:

Acid generators are as shown above.

Acid generator (A'-1) used in Comparative Examples is a compound shown below.

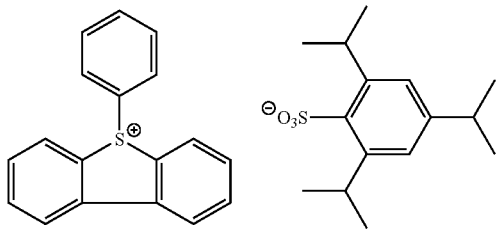

Basic Compounds:
C-1: 2,4,5-Triphenylimidazole
C-2: Triphenylsulfonium acetate
C-3: N-Hydroxyethylpiperidine
C-4: 2,6-Diisopropylaniline
C-6: Tripentylamine
C-10: N-Phenyldiethanolamine
C-11: Trioctylamine
C-12: 1,5-Diazabicyclo[4.3.0]nona-5-ene
Surfactants:
W-1: Megafac F176 (fluorine surfactant, manufactured by Dainippon Ink and Chemicals Inc.)
W-2: Megafac R08 (fluorine/silicon surfactant, manufactured by Dainippon Ink and Chemicals Inc.)
W-3: Polysiloxane polymer KP-341 (silicon surfactant, manufactured by Shin-Etsu Chemical Co., Ltd.)
W-4: Troy Sol S-366 (manufactured by Troy Chemical Co., Ltd.)
Solvents:
A1: Propylene glycol monomethyl ether acetate
B1: Propylene glycol monomethyl ether The components shown in Table 1 below are dissolved in the solvents and filtered through a polytetrafluoroethylene filter having a pore size of 0.1 μm to prepare each positive resist solution having the solid content concentration of 3.5 mass %. Evaluation is performed as follows.

The addition amount of the surfactant is 0.1 mass % to all the solids content.

Evaluation of Resist:

The prepared positive resist solution is uniformly coated on a silicone substrate having been subjected to hexamethyldisilazane treatment by a spin coater, and dried by heating on a hot plate at 120° C. for 60 seconds to form a resist film having a thickness of 70 nm.

Sensitivity and γ Value:

The obtained resist film is subjected to areal exposure by EUV ray (wavelength: 13 nm) with varying the exposure amount 0.5 by 0.5 mJ/cm$^2$ in the range of exposure amount of from 0 to 20.0 mJ/cm$^2$, and further baking at 110° C. for 90 seconds. After that, a dissolving rate of the resist film at each exposure amount is measured with a 2.38 mass % tetramethylammonium hydroxide (TMAH) aqueous solution, and a dissolving rate curve is obtained.

In the dissolving rate curve, the exposure amount at the time when the dissolving rate of the resist is saturated is taken as sensitivity, and dissolving contrast (γ value) is computed from the gradient of the straight line part of the dissolving rate curve. The greater the y value, the better is the dissolving contrast.

Roughness:

At arbitrary 32 points in 10 μm of the machine direction of the line/space pattern of 50 nm in the irradiation amount showing the above sensitivity, the line width is measured with a scanning electron microscope (S-9220, manufactured by Hitachi, Ltd.), and the standard deviation is measured, from which 3σ is computed.

Outgassing Characteristics: the Coefficient of Fluctuation in the Film Thickness after Exposure:

The resist film is irradiated with 2.0 times the quantity of irradiation at sensitivity determined by areal exposure with EUV (mJ/cm$^2$), and the thickness of the film after exposure (before post-baking) is measured, and the coefficient of fluctuation from the film thickness at unexposed time is found according to the following equation.

Coefficient of fluctuation in film thickness (%)=[(film thickness at unexposed time−film thickness after exposure)/film thickness at unexposed time]×100

The results of evaluation are shown in Table 1 below.

TABLE 1

(EUV Exposure)

| Example No. | Composition | | | | | Evaluation | | | |
| --- | --- | --- | --- | --- | --- | --- | --- | --- | --- |
| | Acid Generator (0.25 g) | Resin (2 g) | Basic Compound (0.02 g) | Surfactant | Solvent (mass ratio) | Sensitivity (mJ/cm$^2$) | γ Value | Roughness (nm) | Outgassing (%) |
| Example 1 | A1 | E-2 | C-1 | W-1 | A1/B1 (80/20) | 8.1 | 6.2 | 5.0 | 1.5 |
| Example 2 | A3 | E-2 | C-1 | W-1 | A1/B1 (80/20) | 8.4 | 5.6 | 5.5 | 1.8 |
| Example 3 | A4 | E-3 | C-10 | W-1 | A1/B1 (80/20) | 8.5 | 5.9 | 5.9 | 1.9 |
| Example 4 | A15 | E-3 | C-4 | W-1 | A1/B1 (80/20) | 8.2 | 5.9 | 5.1 | 1.8 |
| Example 5 | A19 | E-2 | C-4 | W-2 | A1/B1 (80/20) | 7.8 | 6.0 | 4.8 | 1.9 |
| Example 6 | A25 | A-1 | C-6 | W-3 | A1/B1 (80/20) | 7.8 | 6.5 | 5.2 | 1.7 |
| Example 7 | A33 | A-1 | C-6 | W-4 | A1/B1 (80/20) | 8.1 | 6.2 | 4.9 | 1.9 |
| Example 8 | A2 | A-2 | C-3 | W-2 | A1/B1 (80/20) | 8.2 | 6.3 | 4.7 | 2.0 |
| Example 9 | A2 | A-2 | C-2 | W-3 | A1/B1 (80/20) | 7.9 | 6.6 | 4.5 | 2.1 |
| Comparative Example 1 | A'-1 | E-1 | C-1 | W-1 | A1/B1 (80/20) | 15.3 | 3.8 | 8.1 | 5.4 |
| Comparative Example 2 | A1 | E-1 | C-1 | W-1 | A1/B1 (80/20) | 12.3 | 4.0 | 7.6 | 2.3 |
| Comparative Example 3 | A'-1 | E-2 | C-1 | W-1 | A1/B1 (80/20) | 11.5 | 4.3 | 7.4 | 5.1 |

It can be seen from the results in Table 1 that the resist compositions in the invention are high sensitivity and high contrast in the characteristic evaluation by irradiation with EUV rays and also excellent in outgassing characteristics as compared with the compositions in Comparative Examples.

With respect to the resist compositions in the invention, the same results are obtained also in patterning with KrF and electron beam exposure, and as negative resist compositions, also.

The invention can provide a resist composition excellent in sensitivity, resolution, roughness, and outgassing characteristics, and a pattern-forming method using the resist composition.

The entire disclosure of each and every foreign patent application from which the benefit of foreign priority has been claimed in the present application is incorporated herein by reference, as if fully set forth.

What is claimed is:

1. A positive resist composition for electron beam, X-ray or EUV comprising:

(A) a compound represented by the following formula (I), and (B) a resin capable of decomposing by the action of an acid to increase solubility in an alkali developing solution, which comprises a repeating unit represented by the following formula (II) and a repeating unit represented by the following formula (III):

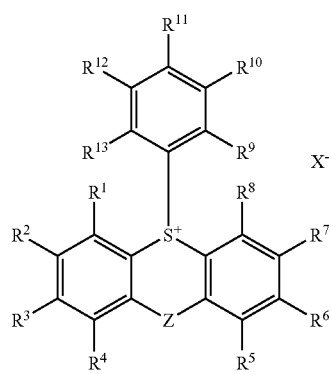

wherein each of $R^1$ to $R^{13}$ independently represents a hydrogen atom or a substituent, provided that at least one of $R^1$ to $R^{13}$ represents a substituent containing an alcoholic hydroxyl group;

Z represents a single bond or a divalent linking group not having an electron attractive property; and $X^-$ represents a counter anion;

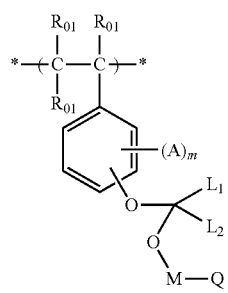

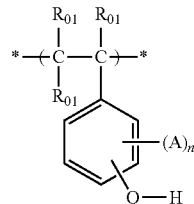

wherein each $R_{01}$ independently represents a hydrogen atom, an alkyl group, a cycloalkyl group, a halogen atom, a cyano group, or an alkoxycarbonyl group;

$L_1$ and $L_2$ may be the same as or different from each other, and each of $L_1$ and $L_2$ independently represents a hydrogen atom, an alkyl group, a cycloalkyl group, or an aralkyl group;

M represents a single bond or a divalent linking group;

Q represents an alkyl group, a cycloalkyl group, or an alicyclic or aromatic ring group which may contain a hetero atom; and at least two of Q, M and $L_1$ may be bonded to each other to form a 5- or 6-membered ring;

A represents a halogen atom, a cyano group, an acyl group, an alkyl group, an alkoxyl group, an acyloxy group, or an alkoxycarbonyl group; and each of m and n independently represents an integer of from 0 to 4, provided that m and n do not represent 0 at the same time.

2. The positive resist composition for electron beam, X-ray or EUV according to claim 1, wherein
the resin (B) has a weight average molecular weight of 5,000 or less.

3. The positive resist composition for electron beam, X-ray or EUV according to claim 1, further comprising:
a basic compound.

4. The positive resist composition for electron beam, X-ray or EUV according to claim 1, wherein
the concentration of all solid contents of the positive resist composition is from 0.2 to 4 mass %.

5. The positive resist composition for electron beam, X-ray or EUV according to claim 1, wherein
$X^-$ in formula (I) is an anion represented by the following formula (X):

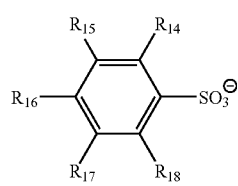

wherein
each of $R_{14}$ to $R_{18}$ independently represents a hydrogen atom or a substituent.

6. The positive resist composition for electron beam, X-ray, or EUV according to claim 1, which is exposed with electron beam, X-ray, or EUV.

7. A pattern-forming method comprising:
forming a resist film with the composition according to claim 1, exposing the resist film with electron beam, X-ray, or EUV, and developing the resist film.

8. The positive resist composition for electron beam, X-ray or EUV according to claim 1, wherein Z is a single bond.

9. The positive resist composition for electron beam, X-ray or EUV according to claim 1, wherein when one or more of $R^1$ to $R^{13}$ represents a substituent containing an alcoholic hydroxyl group, each of said one or more of $R^1$ to $R^{13}$ is independently represented by —W—Y, where Y is an alkyl group substituted with a hydroxyl group, and W is a single bond or a divalent linking group.

10. A positive resist composition for electron beam, X-ray or EUV comprising:

(A) a compound represented by the following formula (I), and (B) a resin capable of decomposing by the action of an acid to increase solubility in an alkali developing solution, which comprises a repeating unit represented by the following formula (II), a repeating unit represented by the following formula (III), and a repeating unit represented by the following formula (IV):

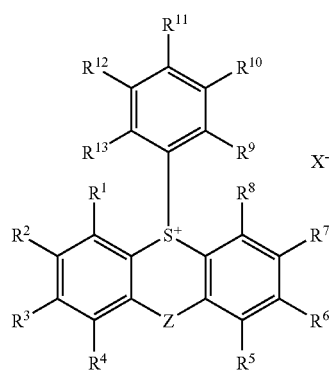

wherein each of $R^1$ to $R^{13}$ independently represents a hydrogen atom or a substituent, provided that at least one of $R^1$ to $R^{13}$ represents a substituent containing an alcoholic hydroxyl group;

Z represents a single bond or a divalent linking group not having an electron attractive property; and $X^-$ represents a counter anion;

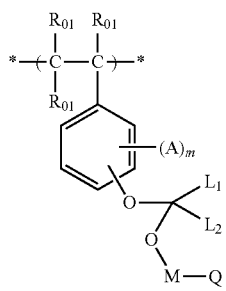

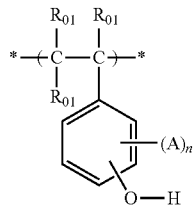

wherein each $R_{01}$ independently represents a hydrogen atom, an alkyl group, a cycloalkyl group, a halogen atom, a cyano group, or an alkoxycarbonyl group;

$L_1$ and $L_2$ may be the same as or different from each other, and each of $L_1$ and $L_2$ independently represents a hydrogen atom, an alkyl group, a cycloalkyl group, or an aralkyl group;

M represents a single bond or a divalent linking group;

Q represents an alkyl group, a cycloalkyl group, or an alicyclic or aromatic ring group which may contain a hetero atom; and at least two of Q, M and $L_1$ may be bonded to each other to form a 5- or 6-membered ring;

A represents a halogen atom, a cyano group, an acyl group, an alkyl group, an alkoxyl group, an acyloxy group, or an alkoxycarbonyl group; and each of m and n independently represents an integer of from 0 to 4;

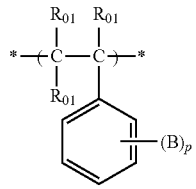

wherein each $R_{01}$ independently represents a hydrogen atom, an alkyl group, a cycloalkyl group, a halogen atom, a cyano group, or an alkoxycarbonyl group;

B represents a halogen atom, a cyano group, an acyl group, an alkyl group, an alkoxyl group, an acyloxy group, or an alkoxycarbonyl group; and p represents an integer of from 0 to 5;

wherein the resin (B) has a weight average molecular weight of 5,000 or less.

11. The positive resist composition for electron beam, X-ray or EUV according to claim 10, further comprising:

a basic compound.

12. The positive resist composition for electron beam, X-ray or EUV according to claim 10, wherein
X⁻ in formula (I) is an anion represented by the following formula (X):

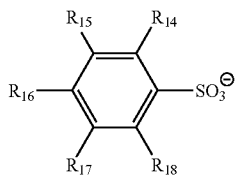

wherein
each of $R_{14}$ to $R_{18}$ independently represents a hydrogen atom or a substituent.

13. The positive resist composition for electron beam, X-ray, or EUV according to claim 10, which is exposed with electron beam, X-ray, or EUV.

14. A pattern-forming method comprising:
forming a resist film with the composition according to claim 10,
exposing the resist film with electron beam, X-ray, or EUV, and
developing the resist film.

15. The positive resist composition for electron beam, X-ray or EUV according to claim 10, wherein Z is a single bond.

16. A positive resist composition for electron beam, X-ray or EUV comprising:
(A) a compound represented by the following formula (I), and
(B) a resin capable of decomposing by the action of an acid to increase solubility in an alkali developing solution, which comprises a repeating unit represented by the following formula (II), a repeating unit represented by the following formula (III), and a repeating unit represented by the following formula (IV):

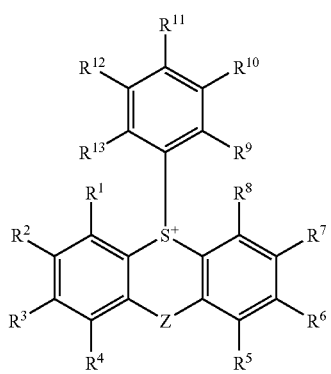

wherein
each of $R^1$ to $R^{13}$ independently represents a hydrogen atom or a substituent, provided that at least one of $R^1$ to $R^{13}$ represents a substituent containing an alcoholic hydroxyl group;
Z represents a single bond or a divalent linking group not having an electron attractive property; and
X⁻ represents a counter anion;

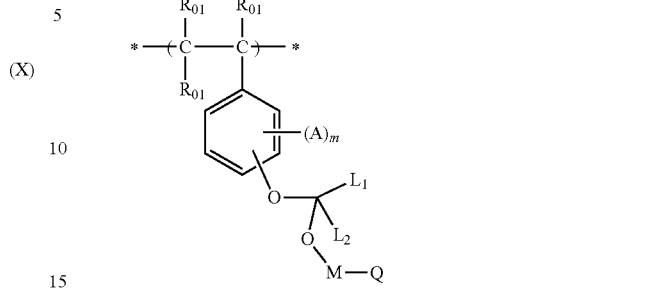

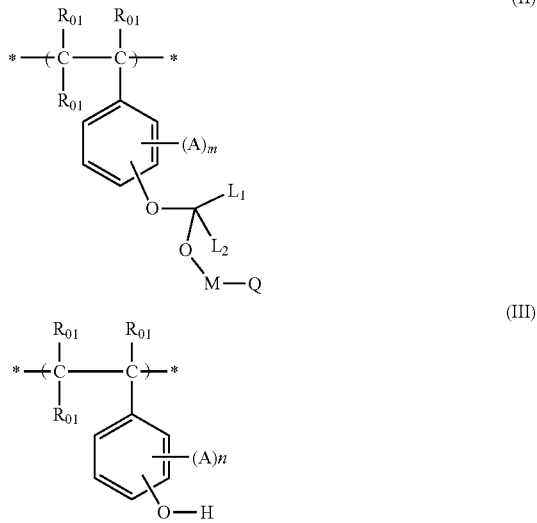

wherein
each $R_{01}$ independently represents a hydrogen atom, an alkyl group, a cycloalkyl group, a halogen atom, a cyano group, or an alkoxycarbonyl group;
$L_1$ and $L_2$ may be the same as or different from each other, and each of $L_1$ and $L_2$ independently represents a hydrogen atom, an alkyl group, a cycloalkyl group, or an aralkyl group;
M represents a single bond or a divalent linking group;
Q represents an alkyl group, a cycloalkyl group, or an alicyclic or aromatic ring group which may contain a hetero atom; and
at least two of Q, M and $L_1$ may be bonded to each other to form a 5- or 6-membered ring;
A represents a halogen atom, a cyano group, an acyl group, an alkyl group, an alkoxyl group, an acyloxy group, or an alkoxycarbonyl group; and
each of m and n independently represents an integer of from 0 to 4;

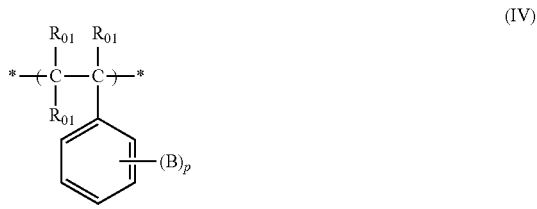

wherein
each $R_{01}$ independently represents a hydrogen atom, an alkyl group, a cycloalkyl group, a halogen atom, a cyano group, or an alkoxycarbonyl group;
B represents a halogen atom, a cyano group, an acyl group, an alkyl group, an alkoxyl group, an acyloxy group, or an alkoxycarbonyl group; and
p represents an integer of from 0 to 5;
wherein
the concentration of all solid contents of the positive resist composition is from 0.2 to 4 mass %.

17. The positive resist composition for electron beam, X-ray or EUV according to claim 16, further comprising:
a basic compound.

18. The positive resist composition for electron beam, X-ray or EUV according to claim 16, wherein
X⁻ in formula (I) is an anion represented by the following formula (X):

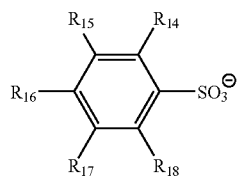
(X)

wherein
each of $R_{14}$ to $R_{18}$ independently represents a hydrogen atom or a substituent.

19. The positive resist composition for electron beam, X-ray, or EUV according to claim 16, which is exposed with electron beam, X-ray, or EUV.

20. A pattern-forming method comprising:
forming a resist film with the composition according to claim 16,
exposing the resist film with electron beam, X-ray, or EUV, and
developing the resist film.

* * * * *